United States Patent
Sato

(10) Patent No.: US 12,157,171 B2
(45) Date of Patent: Dec. 3, 2024

(54) SURFACE-COATED CUTTING TOOL

(71) Applicant: MITSUBISHI MATERIALS CORPORATION, Tokyo (JP)

(72) Inventor: Shun Sato, Tokyo (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 97 days.

(21) Appl. No.: 17/913,919

(22) PCT Filed: Mar. 12, 2021

(86) PCT No.: PCT/JP2021/010128
§ 371 (c)(1),
(2) Date: Sep. 23, 2022

(87) PCT Pub. No.: WO2021/200042
PCT Pub. Date: Oct. 7, 2021

(65) Prior Publication Data
US 2023/0119858 A1 Apr. 20, 2023

(30) Foreign Application Priority Data
Mar. 30, 2020 (JP) .................. 2020-059802

(51) Int. Cl.
*B23B 27/14* (2006.01)
*C23C 14/06* (2006.01)
*B23B 51/00* (2006.01)

(52) U.S. Cl.
CPC ........ *B23B 27/146* (2013.01); *C23C 14/0617* (2013.01); *C23C 14/0635* (2013.01);
(Continued)

(58) Field of Classification Search
None
See application file for complete search history.

(56) References Cited

U.S. PATENT DOCUMENTS 8,354,177 B2 * 1/2013 Maeda .................. C23C 30/005
51/307
2006/0269788 A1 * 11/2006 Ishikawa ............... C23C 14/325
428/701
2019/0193165 A1 6/2019 Takahashi et al.

FOREIGN PATENT DOCUMENTS

EP 3346026 A1 * 7/2018 .......... B23B 27/146
JP 2008-49454 A 3/2008
(Continued)

OTHER PUBLICATIONS

Extended European Search Report issued in European Patent Application No. EP 21782187.5, mailed Mar. 21, 2024.

*Primary Examiner* — Seth Dumbris

(74) *Attorney, Agent, or Firm* — Locke Lord LLP; James E. Armstrong, IV; Nicholas J. DiCeglie, Jr.

(57) ABSTRACT

A surface coated cutting tool comprises: a tool substrate and a coating layer on a surface of the tool substrate; wherein the coating layer comprises a lower layer, an intermediate layer, and an upper layer, in sequence from the tool substrate toward the surface of the tool. The lower layer comprises an A layer having an average composition represented by formula: $(Al_{1-x}Cr_x)N$, where x is 0.20 to 0.60; the intermediate layer comprises a B layer having an average composition represented by formula: $(Al_{1-a-b}Cr_aSi_b)N$, where a is 0.20 to 0.60 and b is 0.01 to 0.20; and the upper layer comprises a C layer having an average composition represented by formula: $(Ti_{1-\alpha-\beta}Si_\alpha W_\beta)N$ where $\alpha$ is 0.01 to 0.20 and $\beta$ is 0.01 to 0.10; and the upper layer has a repeated variation in W level with an average interval of 1 nm to 100 nm between adjacent local maxima and minima.

4 Claims, 4 Drawing Sheets

(52) U.S. Cl.
CPC ...... *C23C 14/0664* (2013.01); *B23B 51/0002* (2022.01); *B23B 2222/04* (2013.01); *B23B 2222/64* (2013.01); *B23B 2222/88* (2013.01)

(56) References Cited

FOREIGN PATENT DOCUMENTS

| | | |
|---|---|---|
| JP | 2008-173701 A | 7/2008 |
| JP | 2011-93085 A | 5/2011 |
| JP | 2011-161590 A | 8/2011 |
| JP | 2012-45650 A | 3/2012 |
| JP | 5087427 B2 | 12/2012 |
| JP | 2020-146777 A | 9/2020 |

* cited by examiner

[Fig. 1]
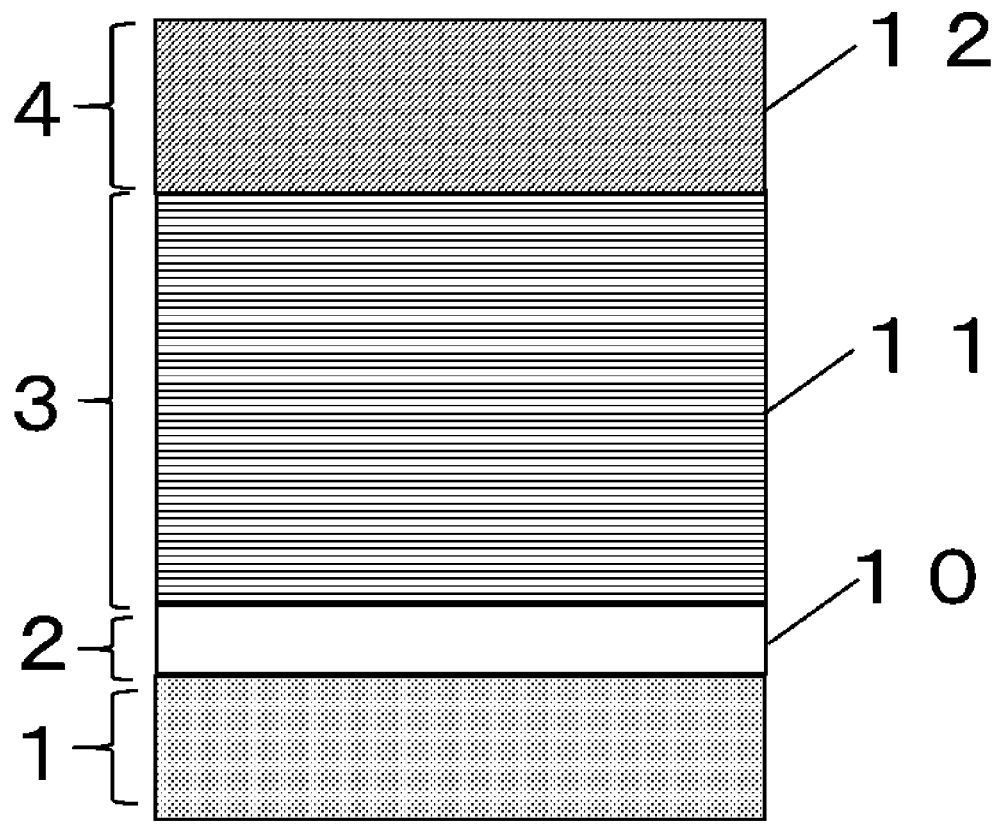
[Fig. 2]
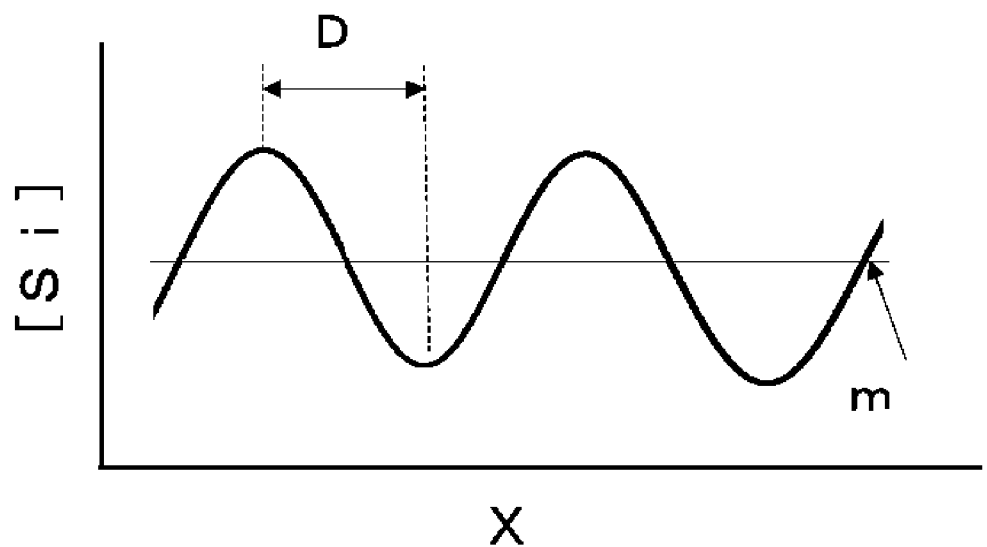

[Fig. 3]
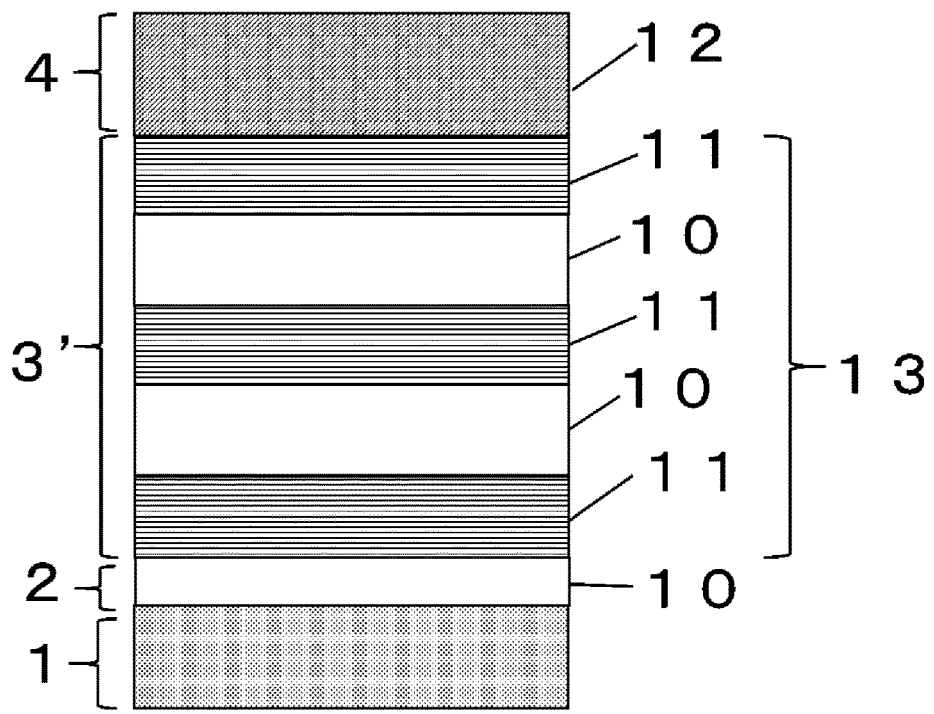
[Fig. 4]
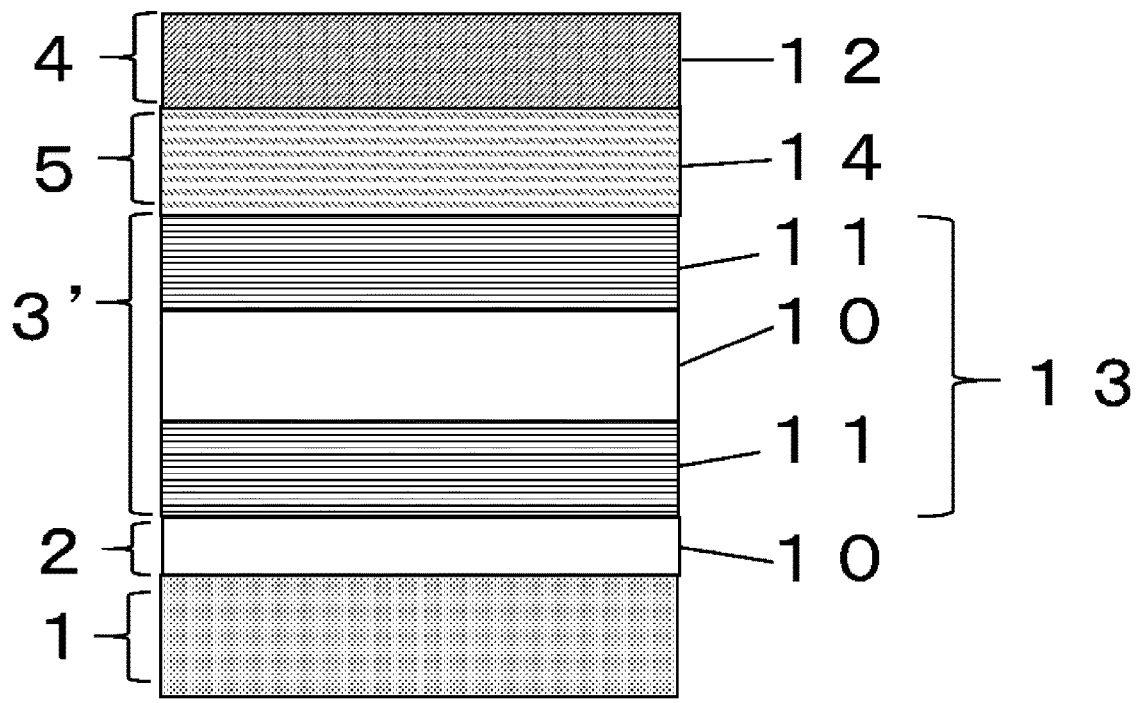

[Fig. 5]
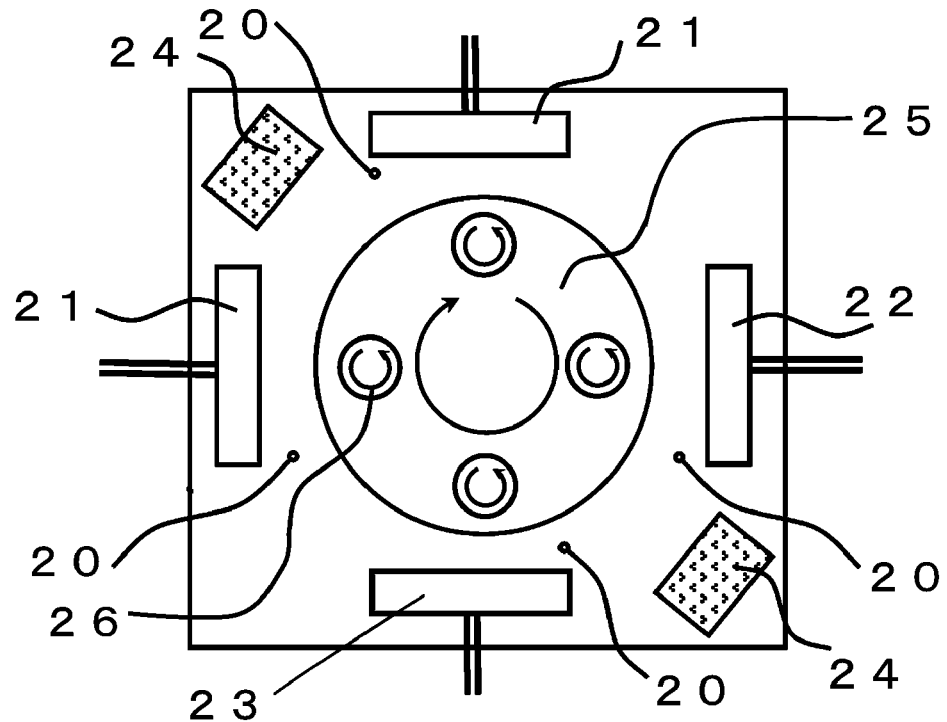
[Fig. 6]
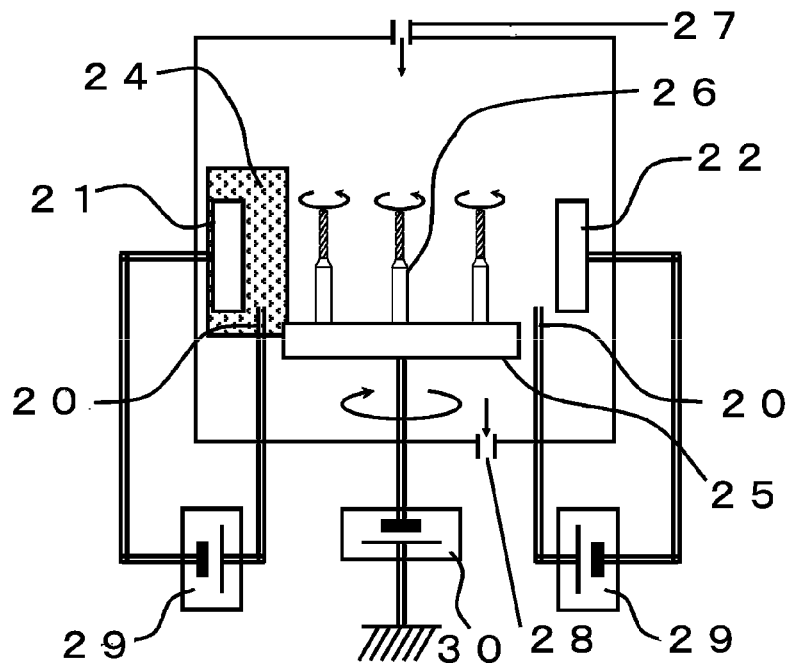

[Fig. 7]
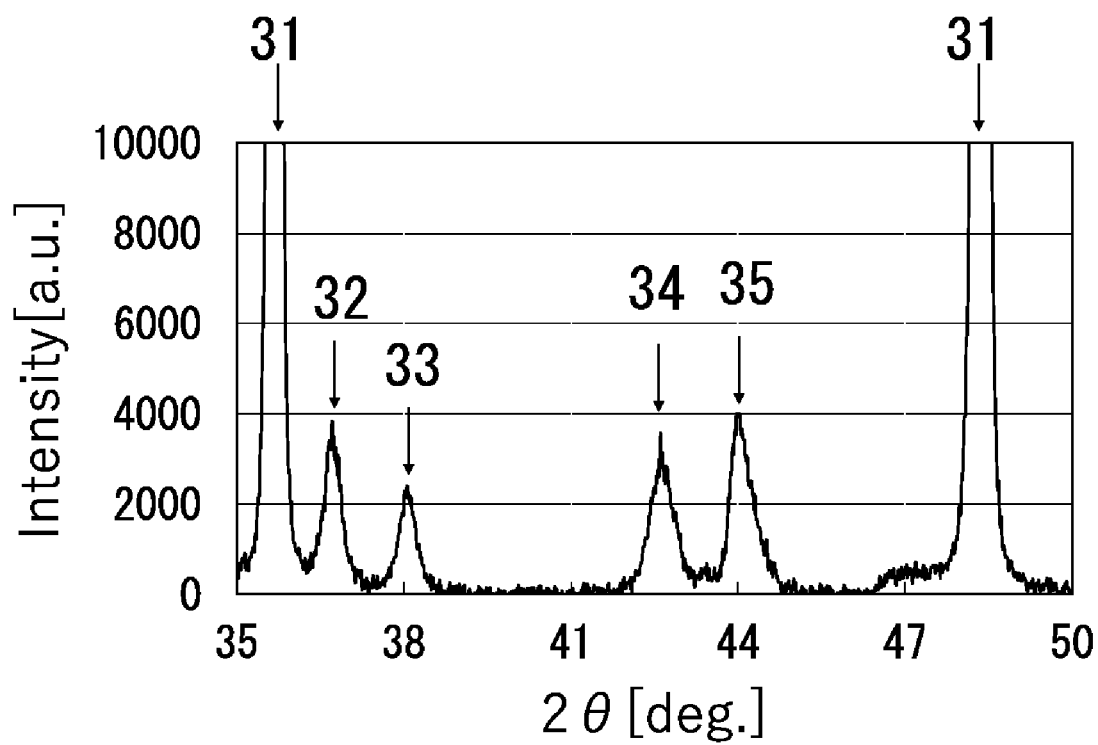

SURFACE-COATED CUTTING TOOL

TECHNICAL FIELD

The present invention relates to a surface coated cutting tool (hereinafter, also referred to as coated tool). This application claims priority benefit of Japanese Patent Application No. 2020-59802 filed on Mar. 30, 2020. The entire contents of the Japanese application are hereby incorporated by reference herein.

BACKGROUND ART

The performance of recent cutting equipment has remarkably improved, while there are still strong demands for labor-saving, energy-saving, and low-cost cutting processes. Cutting conditions have accordingly become more demanding.

Coated tools are known that each includes a hard coating layer composed of a composite nitride layer of aluminum and chromium formed on a surface of a tool substrate composed of tungsten carbide (hereinafter referred to as WC) based cemented carbide by arc ion plating.

A variety of proposals have also been made to improve the cutting performance of coated tools.

For example, PTL 1 discloses a coated tool including a first coating layer and a second coating layer, where the first coating layer has a composition represented by $(Al_a Cr_{100-a-b}Si_b)_c N_d$ (where $50 \le a \le 70$, $0 \le b < 15$, and $0.85 \le c/d \le 1.25$), the second coating layer has a composition represented by $(Ti_{100-e}Si_e)_f N_g$ (where $1 \le e \le 20$ and $0.85 \le f/g \le 1.25$), and the first coating layer and the second coating layer satisfy the relation $0.965 \le d1/d2 \le 0.990$ where d1 and d2 are spacings (nm) of the (200) plane in X-ray diffraction of the first coating layer and the second coating layer, respectively. The coated tool has reduced compressive stress and tight adhesion of the thick coating layer to the tool substrate, resulting in an improvement in wear resistance.

PTL 2 discloses a coated tool that includes a coating layer consisting of a coating layer 1 adjacent to a tool substrate and a coating layer 2 remote from the tool substrate. The coating layer 1 has a composition represented by $(Al_a Cr_{1-a})_{1-x}N_x$ (where $0.50 \le a < 0.70$ and $0.48 \le x \le 0.52$), and satisfies the relation: $0.7 \le W_1 \le 1.1$ (where $W_1$ is a half-value width (degree) of the 111 diffraction peak) and the relations: $0.3 \le Is/Ir < 1.0$ and $0.3 \le It/Ir < 1$ where Ir is the intensity of a (111) diffraction peak, Is is the intensity of a (200) diffraction peak, and It is the intensity of a (220) diffraction peak in X-ray diffractometry of the coating layer 1. The coating layer 2 has a composition represented by $(Ti_{1-b}Si_b)_{1-y}N_y$ (where $0.01 \le b \le 0.25$ and $0.48 \le y \le 0.52$), and satisfies the relation: $0.6 \le W_2 \le 1.1$ (where $W_2$ is a half-value width (degree) of the (111) diffraction peak) and the relations: $0.3 \le Iv/Iu < 1$ and $0.3 \le Iw/Iu < 1.0$ (where Iu is the intensity of a (111) diffraction peak, Iv is the intensity of a (200) diffraction peak, and Iw is the intensity of a (220) diffraction peak in X-ray diffractometry of the coating layer 2. The coating layer 1 and the coating layer 2 each have a face-centered cubic structure, and satisfy the relation: $0.970 \le a1/a2 \le 0.980$ where a1 and a2 are spacings (nm) of the (111) plain of these layers in X-ray diffractometry. The coated tool exhibits high adhesion strength between the tool substrate and the coating layer and thus has excellent wear resistance.

PTL 3 discloses a coated tool that includes a laminated coating layer including at least two first coating layers and at least two second coating layers alternatingly deposited. Each first coating layer is a nitride layer represented by formula: $Al(100-x-y-z)Cr(x)V(y)B(z)$ (where $20 \le x \le 40$, $2 \le y \le 15$, and $2 \le z \le 15$), each second coating layer is a nitride layer represented by formula: $Ti(100-v-w)Cr(v)Si(w)$ (where $5 \le v \le 30$ and $5 \le w \le 30$). The first and second coating layers each have a thickness in a range of 1 to 20 nm. The laminated coating layer has a mixed structure portion having a mixed structure of the components of the first coating layer and the components of the second coating layer, and the area of the mixed structure portion occupies 5 to 80% of the cross-sectional area of the laminated coating layer. The coated tool exhibits excellent wear resistance in cutting of the hardened steel.

CITATION LIST

Patent Literature

PTL 1: Japanese Unexamined Patent Application Publication No. 2011-93085
PTL 2: Japanese Unexamined Patent Application Publication No. 2012-45650
PTL 3: Japanese Patent No. 5087427

SUMMARY OF INVENTION

Technical Problem

An object of the present invention, which was made in view of the circumstances described above, to provide a coated tool including a coating layer exhibiting excellent chipping resistance and fracture resistance during high-load cutting operations in which a high load is applied to the cutting edge, for example, high-speed, high-feed deep hole drilling of work materials, such as carbon steel, alloy steel, and stainless steel. The coated tool exhibits excellent wear and breakage resistance over long periods of use.

Solution to Problem

A surface coated cutting tool according to an embodiment of the present invention comprises:

1) a tool substrate and a coating layer on a surface of the tool substrate; wherein
2) the coating layer has an average thickness in a range of 0.5 μm to 8.0 μm, and the coating layer comprises a lower layer, an intermediate layer, and an upper layer, in sequence from the tool substrate toward the surface of the tool;
3) the lower layer has an average thickness in a range of 0.1 μm to 4.0 μm and comprises an A layer having an average composition represented by formula: $(Al_{1-x}Cr_x)N$, where x is 0.20 to 0.60;
4) the intermediate layer has an average thickness in a range of 0.1 μm to 4.0 μm and comprises a B layer having an average composition represented by formula: $(Al_{1-a-b}Cr_a Si_b)N$, where a is 0.20 to 0.60 and b is 0.01 to 0.20;
5) the B layer has a repeated variation in Si level with an average interval of 1 nm to 100 nm between adjacent local maxima and local minima, and satisfies the relation: $1.0 < Si_{max}/b \le 2.0$ where $Si_{max}$ is the average of the local maxima of the Si level and the relation $0.0 \le Si_{min}/b < 1.0$ where $Si_{min}$ is the average of the local minima of the Si level;
6) the upper layer has an average thickness in a range of 0.1 μm to 4.0 μm and comprises a C layer having an average composition represented by formula: $(Ti_{1-\alpha-\beta}Si_\alpha W_\beta)N$ where $\alpha$ is 0.01 to 0.20 and $\beta$ is 0.01 to 0.10; and 7) the C layer has a repeated variation in W level with an average interval of 1 nm to 100 nm between adjacent local maxima and local minima, and satisfies the relation: $1.0 < W_{max}/\beta \leq 2.0$ where $W_{max}$ is the average of the local maxima of the W level and the relation: $0.0 \leq W_{min}/\beta < 1.0$ where $W_{min}$ is the average of the local minima of the W level.

The surface coated cutting tool according to the embodiment may further satisfy one or more of the following conditions (1) to (3):

(1) The intermediate layer comprises a D layer comprising alternating B layers and A layers, the D layer having an average thickness in a range of 0.5 μm to 4.0 μm, the D layer including at least two B layers.

(2) The surface coated cutting tool further comprises an adhesive layer that has an average thickness in a range of 0.1 μm to 2.0 μm and comprises an E layer having a composition represented by formula: $(Al_{1-k-l-m-n}Ti_kCr_lSi_mW_n)N$ where k is 0.20 to 0.65, l is 0.10 to 0.35, m is above 0.00 to 0.15 or less, and n is above 0.00 to 0.05 or less; wherein the E layer has a repeated variation in Si level with an average interval of 1 nm to 100 nm between adjacent local maxima and local minima, and satisfies the relation: $1.0 < Si_{max(E)}/m \leq 2.0$ where $Si_{max(E)}$ is the average of the local maxima of the Si level and the relation: $0.0 \leq Si_{min(E)}/b < 1.0$ where $Si_{min(E)}$ is the average of the local minima of the Si level.

(3) Each layer included in the coating layer includes crystal grains having a rock-salt cubic crystal structure; a combined X-ray (200) diffraction peak derived from the A layer and the B layer has a full width at half maximum ranging from 0.2 degrees to 1.0 degrees; the intensity $I_{AB200}$ of the (200) diffraction peak and the intensity $I_{AB111}$ of the (111) diffraction peak are correlated by expression: $0.5 < I_{AB200}/I_{AB111} < 10.0$; and the intensity $I_{C200}$ of the (200) diffraction peak and the intensity $I_{C111}$ of the (111) diffraction peak derived from the C layer are correlated by expression: $0.5 < I_{C200}/I_{C111} < 10.0$.

Advantageous Effects of Invention

As described above, the coated tool exhibits excellent chipping resistance, fracture resistance, and wear resistance even in high-load cutting of carbon steel, alloy steel, and stainless steel under high loads applied to the cutting edge.

BRIEF DESCRIPTION OF DRAWINGS

FIG. 1 is a schematic diagram of a longitudinal section of a coating layer of a surface coated cutting tool according to one embodiment of the invention.

FIG. 2 is a schematic diagram illustrating a repeated variation in Si level in the longitudinal section of the coating layer of the surface coated cutting tool according to one embodiment of the present invention.

FIG. 3 is a schematic diagram of a longitudinal section of a coating layer of a surface coated cutting tool according to another embodiment of the present invention.

FIG. 4 is a schematic diagram of a longitudinal section of a coating layer of a surface coated cutting tool according to a further embodiment of the present invention.

FIG. 5 is a schematic plan view of an arc ion plating (AIP) system used to form a coating layer in examples.

FIG. 6 is a schematic front view of the arc ion plating system shown in FIG. 5.

FIG. 7 is a graph illustrating the results of XRD analysis of Example 6.

DESCRIPTION OF EMBODIMENTS

The inventor has reviewed the coated tools disclosed in PTLs 1 to 3, and has found that no particular problems occur in use of these coated tools for cutting of steel or cast iron under normal conditions, but chipping and fracture readily occur without sufficient wear resistance in use under high-load application, resulting in a relatively short service life. The inventor has further discovered that the cutting resistance increases due to welding, chip clogging and the drill may reach its service life due to breakage of a drill when used as a drill (especially a small-diameter drill or a small-diameter long drill).

Specifically, the inventor has found that the hard coating layer disclosed in PTL 1, which is a composite nitride layer of (Al, Cr, Si)N and (Ti, Si)N layers, has high hardness and excellent oxidation resistance and wear resistance, but the resistance against chipping and fracture decreases in cutting operations under application of a continuous high load to the cutting edge such as high-speed high-feed deep-hole drilling.

The inventor has also found that the coated tool disclosed in PTL 2 has problems with reduced chipping resistance and fracture resistance during cutting operations under application of a continuous high load to the cutting edge.

The inventor has further found that the coated tool with a coating layer consisting of alternating (Al, Cr, V, B)N and (Ti, Cr, Si)N layers disclosed in PTL 3 shows excellent wear resistance in cutting of hard materials, but unavoidably generates chipping and fracture leading to a short tool life in use under severe cutting conditions where a high load is applied to the cutting edge.

Based on these perceptions, the inventor has made the following findings (1) and (2) as a result of further study.

(1) The (Al, Cr, Si)N layer disclosed in PTL1 contains Al, which improves high-temperature hardness and heat resistance, Cr, which improves high-temperature strength and improves oxidation resistance at high temperatures in the co-presence of Cr and Al, and Si, which improves heat resistance. The Si component however increases the lattice distortion of the (Al, Cr, Si)N layer; hence, the (Al,Cr,Si)N layer does not have sufficient toughness to withstand high loads on the cutting edge, resulting in ready chipping and fracture.

(2) In particular, in the case of formation of a coating layer having a stacked structure of the (Al,Cr,Si)N layer and another hard layer, a further reduction in toughness of the coating layer as a whole, in addition to the low toughness of the (Al, Cr, Si)N layer itself, occurs by lattice mismatch at the stacking interface with the other hard layer, without avoidance of chipping and fracture.

On the basis of these results, the inventor has further studied the (Al,Cr,Si)N layer. The inventor has modified the contents and distributions of ingredients in this layer and finally has found another hard layer that is less prone to lattice distortion and has high adhesion to both the tool substrate and the (Al,Cr,Si)N layer.

In detail, the inventor has prepared a coating layer having a stacked structure including the (Al,Cr,Si)N layer, a composite nitride layer of aluminum and chromium (hereinafter, also referred to as (Al,Cr)N layer), and a composite nitride layer of titanium, silicon, and tungsten (hereinafter, also referred to as (Ti,Si,W)N layer, and has discovered that the coating layer has improved adhesive strength and high toughness and that a coated tool including the coating layer exhibits high chipping resistance, high fracture resistance, high wear resistance, and high breakage resistance under cutting conditions where high loads are applied.

The coated tool according to embodiments of the present invention will now be described in detail.

Throughout the specification and the claims, when a numerical value range is expressed as "L to M" (L and M are both numerical values), the range includes the upper limit (M) and the lower limit (L), and the upper limit (M) and lower limit (L) have the same unit.

I. Embodiment Shown in FIG. 1

FIG. 1 schematically illustrates a longitudinal section of a coating layer of a surface coated cutting tool according to one embodiment of the invention (a cross-section perpendicular to the surface when the minute irregularities on the surface of the tool substrate are ignored and treated as a smooth surface for an insert, or a cross section perpendicular to the axis for an axial tool such as a drill). The description will start with the embodiment shown in FIG. 1.

1. Coating Layer

In the embodiment shown in FIG. 1, the coating layer includes a lower layer (2), an intermediate layer (3), and an upper layer (4), in sequence, on a tool substrate (1). The lower layer (2), the intermediate layer (3), and the upper layer (4) are also referred to an A layer (10), a B layer (11), and a C layer (12), respectively, which will be described in detail.

The coating layer preferably has an average thickness, i.e., an average total thickness of the lower layer, intermediate layer, and upper layer in a range of 0.5 to 8.0 μm because a thickness below 0.5 μm does not lead to high wear resistance of the coating layer over long-term use whereas a thickness above 8.0 μm leads to abnormal damage, such as chipping, fracture, and separation of the upper layer.

More preferably, the coating layer has an average thickness in a range of 1.0 to 6.0 μm.

(1) Lower Layer

The lower layer is an A layer having a predetermined composition (Al,Cr)N. In the (Al,Cr)N layer, Al contributes to improvements in high-temperature hardness and heat resistance, Cr contributes to improvements in high-temperature strength and lubricity, and coexistence of Al and Cr contribute to improvements in oxidation resistance and wear resistance of the lower layer.

In the case that the average composition of the A layer is expressed by the formula: $(Al_{1-x}Cr_x)N$, x is preferably in a range of 0.20 to 0.60.

If x is less than 0.20, the chipping resistance of the coating layer decreases due to a decrease in high-temperature strength of the lower layer, the hardness and thus wear resistance of the coating layer decreases due to formation of hexagonal crystal grains caused by an increase in relative Al content. If x is greater than 0.6, the lower layer does not exhibit sufficient high-temperature hardness and heat resistance caused by a decrease in relative Al content, resulting in a decrease in wear resistance of the coating layer.

More preferably, x ranges from 0.25 to 0.50.

The lower layer or A layer preferably has an average thickness in a range of 0.1 to 4.0 μm for the following reasons.

If the A layer has an average thickness less than 0.1 μm, the A layer does not sufficiently adhere to the tool substrate. If the A layer has an average thickness greater than 4.0 μm, the A layer has large internal distortion that causes abnormal damage such as chipping and separation between the A layer and the tool substrate to lose the function as an adhesive layer. The average thickness more preferably ranges from 0.1 to 2.0 μm.

In accordance with one example method of manufacturing the coated tool described below, the ratio of (Al, Cr) to N is to be 1:1. However, some products unavoidably (unintentionally) do not have a ratio of 1:1. This also holds for other composite nitrides described below.

(2) Intermediate Layer

The intermediate layer or B layer is composed of (Al,Cr,Si)N with a predetermined texture. In the compound (Al,Cr,Si)N, like (Al,Cr)N, Cr improves the high-temperature strength and lubricancy of the intermediate layer, and the chipping resistance. Coexistence of Cr and Al contributes to improvements in high-temperature oxidation resistance and wear resistance of the intermediate layer.

Si improves heat resistance and thermoplastic deformation resistance, and increases the lattice distortion of the intermediate layer at the same time to decrease the chipping resistance of the intermediate layer; hence, a repeated variation in Si level (concentration) is provided, as described below.

The intermediate layer or B layer preferably has an average thickness in a range of 0.1 to 4.0 μm. An average thickness less than 0.1 μm does not ensure sufficient wear resistance of the coating layer over long time periods. An average thickness greater than 4.0 μm accelerates abnormal damage, such as chipping, fracture, and separation of the coating layer. The intermediate layer or B layer more preferably has an average thickness in a range of 0.1 to 2.0 μm.

In the case that the average composition of the B layer is expressed by the formula: $(Al_{1-a-b}Cr_aSi_b)N$, it is preferred that a is 0.20 to 0.60 and b is 0.01 to 0.20 for the following reasons.

If a is less than 0.20, the chipping resistance of the coating layer decreases due to a decrease in high-temperature strength of the B layer, the hardness and thus wear resistance of the coating layer decreases due to formation of hexagonal crystal grains in the B layer caused by an increase in relative Al content. If a is greater than 0.6, the B layer does not exhibit sufficient high-temperature hardness and heat resistance caused by a decrease in relative Al content, resulting in a decrease in wear resistance of the coating layer. More preferably a ranges from 0.25 to 0.50.

If b is less than 0.01, the B layer barely improves the heat resistance and thermoplastic deformation resistance. If b exceeds 0.20, the function of improving wear resistance decreases, and the lattice distortion of the B layer increases at the same time, resulting in a decrease in the toughness of the B layer itself. As a result, the chipping and fracture resistance of the coating layer decreases under high-load cutting conditions. The more preferred range for b is from 0.01 to 0.15.

In order to mitigate the lattice distortion in the B layer and to maintain the chipping and fracture resistance of the coating layer, a structure with a repeated variation in Si level is formed in the B layer in this embodiment.

In order to reduce the lattice distortion more reliably, it is preferred to form a repeated variation in Si level causing an average interval of 1 to 100 nm between adjacent local maxima and local minima of the Si level, i.e., the average interval in the direction perpendicular to the tool substrate surface (thickness direction of the layer, as described below in "III. Measurement" below). This repeated variation suppresses the abrupt variation in Si content between the A and B layers and reduces lattice distortion more reliably, resulting in enhanced adhesion between the two layers and preventing separation of the coating layer and enhanced chipping resistance and fracture resistance.

FIG. 2 shows a schematic diagram of a repeated variation in Si level ([Si]) on the vertical axis versus the position (X) perpendicular to the surface of the tool substrate on the horizontal axis. The drawing schematically shows an example of the repeated variation in Si level. In FIG. 2, local maxima have the same value and local minima also have the same value, and the intervals between adjacent local maxima and local minima are also the same. However, the repeated variation in Si level referred to in this specification and in the claims means the variation in Si level between the local maxima and local minima. The Si level should vary so that it alternates between local maxima and local minima, and the local maxima and local minima may be the same or different, and the interval (D) between adjacent local maxima and local minima may also be the same or different.

As described above, the average interval between adjacent local maxima and local minima of the Si level is controlled to be 1 to 100 nm for the following reasons: An average interval less than 1 nm leads to an abrupt variation in Si content generating large local lattice distortion, resulting in a decrease in chipping resistance. An average interval greater than 100 nm leads to generation of a wide area of high Si content, i.e., broad lattice distortion that works as a start point of chipping, resulting in a decrease in chipping resistance. The more preferred average interval of the repeated variation ranges from 5 to 50 nm.

In a preferred embodiment, the relation $1.0 < Si_{max}/b \leq 2.0$ holds where $Si_{max}$ is the average of local maxima of the concentrations of the Si component and b is an average content of Si in the composition, whereas the relation $0.0 \leq Si_{min}/b < 1.0$ holds where $Si_{min}$ is the average of local minima of the concentrations of the Si component.

The ratio $Si_{max}/b$ of the average of the local maxima of the concentration of the Si component to b and the ratio $Si_{min}/b$ of the average of the local minima to b are determined for the following reasons: Although a $Si_{max}/b$ above 1.0 or a $Si_{min}/b$ below 1.0 contributes to a reduction in lattice distortion due to a repeated variation of Si level, a $Si_{max}/b$ above 2.0 leads to an abrupt variation in Si component due to a wide range of variations, resulting in a decrease in chipping resistance.

More preferred ranges for $Si_{max}/b$ and $Si_{min}/b$ satisfy the relations $1.2 < Si_{max}/b \leq 2.0$ and $0.0 \leq Si_{min}/b < 0.8$.

The average interval between a position giving a local maxima and the adjacent position giving a local minima of the Si level in the B layer with a repeated variation in Si level is determined as follow: The Si content is measured in a direction perpendicular to the tool substrate surface (layer thickness direction: described in "III. Measurement" below) in the longitudinal section of the tool substrate of the B layer, and the data is then graphed after known noise reduction.

With reference to FIG. 2, a straight line (m) is drawn across the curve showing the repeated variation in Si level. This straight line (m) is drawn such that the area of the region surrounded by the curve is equal on the upper side and the lower side of the straight line (m). The local maxima or local minima of the concentration of the Si component are determined for every area where the straight line (m) crosses the curve showing the repeated variation in Si level, and the intervals between the local maxima and the local minima are measured. The average interval of the repeated variation in Si level in the B layer is determined by averaging the observed values at multiple points.

The averages of the local maxima $Si_{max}$ and the local minima $Si_{min}$ of the Si level are calculated by averaging the local maxima and local minima of the concentrations of the Si component measured at multiple points.

(3) Upper Layer

The upper layer is a C layer having a given composition of (Ti,Si,W)N.

The upper layer exhibits improvements in oxidation resistance and thermo-plastic deformation resistance due to Ti as the primary component and a Si component, as well as improvements in high-temperature strength and wear resistance of the coating layer due to a W component.

The upper layer preferably has an average thickness in a range of 0.1 to 4.0 μm to further improve chipping resistance, fracture resistance, and wear resistance of the coating layer under high-load cutting conditions. More preferred average thickness ranges from 0.1 to 2.0 μm.

The average composition of the C layer is represented by the formula: $(Ti_{1-\alpha-\beta}Si_\alpha W_\beta)N$ where $\alpha$ is preferably in a range of 0.01 to 0.20 and $\beta$ is preferably in a range of 0.01 to 0.10.

If $\alpha$ is less than 0.01, the oxidation resistance and thermoplastic deformation resistance of the C layer barely improves. If $\alpha$ exceeds 0.20, the lattice distortion increases, resulting in breakage of the C layer under high-load cutting conditions.

If $\beta$ is less than 0.01, the strength of the C layer does not significantly increases at high temperature. If $\beta$ exceeds 0.10, lattice distortion increases, resulting in a decrease in chipping resistance of the C layer under high-load cutting operations.

In preferred embodiments, the W level has a repeated variation with an average interval of 1 to 100 nm between adjacent local maxima and local minima, satisfies the relation: $1.0 < W_{max}/\beta \leq 2.0$ where $W_{max}$ is the average of the local maxima of the W level and the relation: $0.0 \leq W_{min}/\beta < 1.0$ where $W_{min}$ is the average of the local minima of the W level, and $\beta$ is the average composition of the C layer.

The reason why 1 to 100 nm is preferred as the average interval between adjacent local maxima and local minima is because an average interval of less than 1 nm leads to an abrupt variation in W content, resulting in large local lattice distortion in the C layer and decreased chipping resistance of the coating layer whereas an average interval exceeding 100 nm leads to a large W-rich area, i.e., a large area of high lattice distortion in the upper layer, accelerates chipping starting from this area, resulting in a decrease in chipping resistance of the coating layer. The average interval of a repeated variation more preferably ranges from 5 nm to 50 nm.

The ratio $W_{max}/\beta$ of the average of the local maxima of W level to $\beta$, and the ratio $W_{min}/\beta$ of the average of the local minima of W level to $\beta$ are determined in the above range for the following reasons: A ratio $W_{max}/\beta$ exceeding 1.0 and a ratio $W_{min}/\beta$ of less than 1.0 lead to a reduction in lattice distortion in the C layer due to a repeated variation in composition. In contrast, a ratio $W_{max}/\beta$ of greater than 2.0 leads to a large variation in composition and a steep variation in the W level. A ratio $W_{max}/\beta$ exceeding 2.0 leads to a large width of variable composition and decreased chipping resistance of the coating layer due to a steep variation in W level. More preferred ranges of the ratios $W_{max}/\beta$ and $W_{min}/\beta$ are represented by the relations: $1.2 < W_{max}/\beta \leq 2.0$ and $0.0 \leq W_{min}/\beta < 0.8$.

For the repeated variation of W level, the average intervals $W_{max}$ and $W_{min}$ can be determined as in the repeated variation in Si level described based on FIG. 2. In other words, Si should be replaced by W in FIG. 2.

(4) Grains with Rock Salt Cubic Crystal Structure (NaCl-Type Face-Centered Cubic Structure)

The crystal grains constituting the A, B, and C layers should preferably have a NaCl-type face-centered cubic structure. In these layers, an unavoidable (unintended) amount of crystal grains having a crystal structure other than the NaCl-type face-centered cubic structure may also be present in industrial production.

(5) XRD Pattern

Preferably, each layer included in the coating layer includes crystal grains having a rock-salt cubic crystal structure; a combined X-ray (200) diffraction peak derived from the A layer and the B layer has a full width at half maximum ranging from 0.2 degrees to 1.0 degrees; the intensity $I_{AB200}$ of the (200) diffraction peak and the intensity $I_{AB111}$ of the (111) diffraction peak are correlated by expression: $0.5 < I_{AB200}/I_{AB111} < 10.0$; and the intensity $I_{C200}$ of the (200) diffraction peak and the intensity $I_{C111}$ of the (111) diffraction peak derived from the C layer are correlated by expression: $0.5 < I_{C200}/I_{C111} < 10.0$.

More preferably the following relations hold: $0.5 < I_{AB200}/I_{AB111} < 5.0$ and $0.5 < I_{C200}/I_{C111} < 5.0$.

Although the grounds for this are not certain, they are as follows:

A full width of less than 0.2 degrees at half height of the X-ray diffraction peak intensity $I_{AB200}$ indicates formation of coarse crystal grains that accelerate propagation of cracks through grain boundaries, resulting in decreased chipping resistance. A full width exceeding 1.0 degree at half height of the X-ray diffraction peak intensity $I_{AB200}$ indicates formation of fine crystal grains that impairs sufficient crystallinity, resulting in a decrease in abrasion resistance. Setting the full width at half value in the above range achieves a small difference in lattice constants of the crystals constituting the A and B layers and small strain due to lattice mismatch at the interface between the A and B layers, resulting in improved chipping resistance.

A ratio $I_{AB200}/I_{AB111}$ of 0.5 or less indicates that the (111) plane orientation, which is the densest plane, is dominant, resulting in lower chipping resistance. A ratio $I_{AB200}/I_{AB111}$ of 10.0 or greater indicates that orientation of the (200) plane is significantly dominant, resulting in lower wear resistance.

Similarly, a ratio $I_{C200}/I_{C111}$ of 0.5 or less indicates that the (111) orientation, which is the densest plane, is dominant, resulting in lower chipping resistance. A ratio $I_{C200}/I_{C111}$ of 10.0 or more indicates that the (200) orientation is significantly dominant, resulting in lower wear resistance.

The combined X-ray diffraction peak derived from the A layer and the B layer indicates that the diffraction peaks from the A layer and the B layer overlap each other and the diffraction peak derived from the A layer or the B layer is not observed solely.

2. Tool Substrate (1) Material

Any known material for tool substrates can be used, as long as it does not hinder the achievement of the above-mentioned purpose. Preferred examples include cemented carbide (WC-based cemented carbide, containing Co in addition to WC, and also containing carbonitrides of Ti, Ta, and Nb); thermets (primarily composed of, for example, TiC, TiN, or TiCN); ceramics (titanium carbide, silicon carbide, silicon nitride, aluminum nitride, or aluminum oxide); cBN sinter; and diamond sinter.

(2) Shape

The tool substrate may have any shape, for example, the shape of an insert or a drill, usable as a cutting tool.

3. Production

The coated tool of this embodiment can be produced, for example, by the following PVD process.

(1) Lower Layer

In one embodiment, a tool substrate (26) is mounted on a turn table (25) under a nitrogen atmosphere in an arc ion plating (AIP) system shown in FIGS. 5 and 6; and an arc discharge is generated between an Al—Cr alloy target (23) and an anode (20) to deposit a lower layer being an A layer with a specified average thickness on the surface of the spinning tool substrate.

(2) Intermediate Layer

In one embodiment, the tool substrate (26) provided with the lower layer placed on the turn table (25) in the arc ion plating system is subjected to simultaneous deposition from an Al—Cr—Si alloy target (22) and an Al—Cr alloy target (23) to form an intermediate layer or B layer containing Si with a repeated variation in Si level.

Even in the case of a single target using only the Al—Cr—Si alloy target, a repeated variation in Si level can be achieved by appropriate determination of the deposition conditions, such as rotation cycle of the turn table, nitrogen pressure and bias voltage during arc discharge, and temperature in the system; a coating layer of this embodiment can thereby be formed.

A repeated variation in Si level with a single target are formed by the distribution of elements during deposition in the system. For example, an increase in nitrogen pressure causes a large difference in the mean free path for each element, resulting in ready formation of a repeated variation in Si level. If the tool substrate temperature is raised by an increase in the bias voltage or the temperature of the system in this case, atomic diffusion is more likely to occur in the coating layer, precluding a repeated variation in Si level. Use of a single target limits independent control of a repeated variation in Si level and the characteristics, such as crystallinity, of the coating layer.

Simultaneous deposition from an Al—Cr—Si alloy target and an Al—Cr alloy target facilitates a repeated variation in Si level and control of the characteristics such as crystallinity to certainly form a coated layer of this embodiment.

It is noted that adjustment of, for example, arc current, bias voltage, pressure of the reaction gas, and deposition temperature among the arc ion plating conditions for deposition of the A and B layers can readily control the $I_{AB200}/I_{AB111}$ within a predetermined range.

(3) Upper Layer

In one embodiment, a tool substrate (26) having a surface provided with a lower layer and an intermediate layer is placed on the turn table (25) in the arc ion plating system and is subjected to simultaneous deposition using two Ti—Si—W alloy targets (21) having two different compositions to form a C layer having a repeated variation in W level. A repeated variation in W level can also be formed through adjustment of the deposition conditions with only Ti—Si—W alloy targets of the same composition, like a repeated variation in Si level in the B layer described above.

The ratio $I_{C200}/I_{C111}$ can be controlled within a predetermined range through adjustment of, for example, arc current, bias voltage, pressure of the reaction gas, and deposition temperature among the arc ion plating conditions for depositing the C layer.

II. Embodiment Shown in FIG. 3

FIG. 3 is a schematic longitudinal section of a coating layer of a surface coated cutting tool for another embodiment of the invention. The embodiment shown in FIG. 3 will now be described.

The parts that duplicate the description of the embodiment shown in FIG. 1 will not be described in detail.

1. Coating Layer

In the embodiment shown in FIG. 3, the coating layer includes a lower layer (2), an intermediate layer (3'), and an upper layer (4) in sequence from the tool substrate (1) toward the surface of the tool, and the lower layer (2) is referred to an A layer (10) and the upper layer (4) is composed of a C layer (12), like the embodiment shown in FIG. 1. In this embodiment, the intermediate layer (3') consists of a D layer (13) including A layers (10) and B layers (11) alternatingly deposited. The number of A layers (10) and B layers (11) is not limited to that shown in FIG. 3.

(1) Intermediate Layer

In this embodiment, the intermediate layer consists of layer D, which is an alternating layering of A layers and B layers. The average thickness of the layer D preferably ranges from 0.5 to 4.0 µm because an average thickness of less than 0.5 µm precludes sufficient wear resistance of the coating layer over a long period of time whereas an average layer thickness exceeding 4.0 µm accelerates abnormal damage, such as chipping, fracture, and separation. In the D layer, the average thicknesses of each of the A and B layers should preferably ranges from 0.1 to 1.5 µm.

With the D layer, it is more preferred that the layer closest to the tool substrate (on the lowest layer) and the layer closest to the tool surface (on the uppermost layer) are both B layers for the following reasons:

The B layer formed closest to the tool substrate ensures high adhesion strength between the lower layer (A layer) and the intermediate layer (D layer) while the B layer formed closest to the surface of the tool improves the adhesion strength to the C layer, which is the upper layer, and ensures the chipping resistance of the coating layer in heavy-load cutting operations.

(2) Number of Deposited Layers

Any number of A and B layers can be deposited in the D layer and the number of deposited layers can be determined with proviso that the average thickness of each of the A and B layers in the D layer ranges from 0.1 to 1.5 µm and the thickness of the intermediate layer is 0.5 to 4.0 µm. Preferably, the number of A layers and B layers are two to five, more specifically, a combination of two A layers and three B layers.

(3) Crystal Grains of Rock-Salt Cubic Crystal Structure and XRD Pattern

The crystal grains of the rock-salt cubic crystal structure and the XRD pattern are the same as described in the description of the embodiment shown in FIG. 1.

2. Tool Substrate

The material for and shape of the tool substrate are the same as those described in the description of the embodiment shown in FIG. 1.

3. Production

Only production of the D layer, which constitutes the intermediate layer, will now be described.

In one embodiment, a tool substrate (26) having the lower layer on the surface on a turn table (25) is subject to simultaneous deposition using an Al—Cr—Si alloy target (22) and an Al—Cr alloy target (23) in the arc ion plating system shown in FIGS. 5 and 6 to deposit an intermediate layer or B layer having an alternatingly deposited structure with a repeated variation in Si level, and then is subject to deposition using the Al—Cr alloy target (23) to form an A layer with a predetermined thickness. This procedure is repeated to form alternatingly deposited B layers and A layers, with each B layer having a repeated variation in Si level.

III. Embodiment Shown in FIG. 4

FIG. 4 is a schematic illustration of a longitudinal section of a coating layer of a surface coated cutting tool for yet another embodiment of the invention. This embodiment shown in FIG. 4 will now be described.

The description of the parts that overlap with the embodiments shown in FIGS. 1 and 3 will not be described in detail.

1. Coating Layer

As shown in FIG. 4, the coating layer has a lower layer (2), an intermediate layer (3'), an upper layer (4), and an adhesive layer (5) between the intermediate layer (3') and the upper layer (4). The number of layers constituting the intermediate layer (3') should not be limited to that shown in the drawing.

(1) Adhesive Layer

In this embodiment, the adhesive layer is composed of an E layer between the intermediate layer (D layer) and the upper layer (C layer). In the case that the Si content b in the B layer of the D layer differs from the Si content α in the C layer, the E layer is provided to enhance the adhesion between the D layer and the C layer.

The E layer preferably has an average thickness in a range of 0.1 to 2.0 µm. An average thickness of the E layer of less than 0.1 µm cannot ensure sufficient adhesion between the C layer and the D layer, whereas an average thickness exceeding 2.0 µm leads to large lattice distortion in the E layer, resulting in a decrease in adhesiveness.

The average composition of the E layer is represented by the formula: $(Al_{1-k-l-m-n}Ti_kCr_lSi_mW_n)N$, where k preferably ranges from 0.20 to 0.65, l preferably ranges from 0.10 to 0.35, m preferably ranges from above 0.00 to 0.15, and n preferably ranges from above 0.00 to 0.05.

The ground for determining the average composition in this manner is as follows: Ti, which improves the high-temperature hardness and high-temperature strength of the E layer, does not provide sufficient high-temperature strength at a content of less than 0.20. In such a case, the Al content is high, resulting in the formation of hexagonal crystals in the E layer, which precludes the function to improve the adhesion of the E layer. An Al content exceeding 0.65 leads to small contents of the other components and thus insufficient wear resistance of the coating layer.

With chromium, which improves high-temperature strength and lubricating characteristics of the E layer, a Cr content of less than 0.10 leads to insufficient lubricating characteristics, whereas a Cr content of greater than 0.35 leads to small contents of the other components and thus insufficient wear resistance of the coating layer.

With silicon, which improves the oxidation resistance and plastic deformation resistance of the E layer, a Si content of 0.00 does not provide sufficient oxidation resistance of the E layer or adhesion of the B layer to the C layer, whereas a Si content exceeding 0.15 increases lattice distortion in the E layer and thus decreases the adhesiveness.

With tungsten, which improves the high-temperature strength and wear resistance of the E layer, a W content of 0.00 leads to insufficient high-temperature strength to the E layer and insufficient adhesion to the C layer due to insufficient affinity therewith, whereas a W content exceeding 0.05 leads to large lattice distortion in the E layer and thus a decrease in adhesiveness.

The adhesive layer preferably satisfies the relation: $1.0 < Si_{max(E)}/m \leq 2.0$, where $Si_{max(E)}$ represents the average of the local maxima of the Si levels in a repeated variation between adjoining local maxima and local minima with an interval between local maxima and local minima in a range of 1 to 100 nm, and the relation: $0.0 \leq Si_{min(E)}/m < 1.0$ where $Si_{min(E)}$ represents the average of the local minima of the Si levels.

The repeated variation in the Si level is the same as that described with reference to FIG. 2.

As described above, the average interval between adjoining local maxima and local minima is preferably in a range of 1 to 100 nm for the following reasons: An average interval of less than 1 nm leads to steep variations in Si component that facilitates chipping of the coating layer and precludes adhesion between the C layer and the D layer in the E layer. An average interval exceeding 100 nm leads to expansion of a region with a high Si content, in other words, a region with large lattice distortion, resulting in ready chipping and unsatisfactory adhesive strength. A more preferred average interval in the repeated variation ranges from 5 to 50 nm.

The ratio $Si_{max(E)}/m$ of the average local maxima of the Si level to m and the ratio $Si_{min(E)}/m$ of the average local minima of the Si level to m are determined as described above, for the following reasons: $Si_{max(E)}/m$ exceeding 2.0 leads to a steep repeated variation in Si level, resulting in a decrease in chipping resistance, although a combination of $Si_{max(E)}/m$ exceeding 1.0 and $Si_{min(E)}/m$ of less than 1.0 can produce a repeated variation in Si level.

(3) Grains with a Rock-Salt Cubic Crystal Structure

Also in the E layer, which constitutes the adhesive layer, the crystal grains preferably have a NaCl-type face-centered cubic structure with respect to the crystal structure of the crystal grains. The E layer, the A layer, the B layer, and the D layer may contain an unavoidable (unintended) amount of crystal grains having a crystal structure other than the NaCl-type face-centered cubic structure.

(4) XRD Pattern

The same as described in the description of the embodiment shown in FIG. 1.

2. Tool Substrate

The material for and shape of the tool substrate are the same as described in the description of the embodiment shown in FIG. 1.

3. Production

Only the method of manufacturing the E layer, which constitutes the adhesive layer, will be described.

In an embodiment, the tool substrate (26) with a lower layer and an intermediate layer formed on its surface on a turn table (25) in the arc ion plating system shown in FIGS. 5 and 6 is subjected to simultaneous deposition using an Al—Cr—Si alloy target (22) and an Ti—Si—W alloy target (21) to form an adhesive layer or E layer containing Si with a repeated variation in Si level.

Although the intermediate layer is a D layer, which is an alternating stack of A layers and B layers, in the embodiment shown in FIG. 4, the intermediate layer may consist of only a B layer.

III. Measurements

1. Measurements of Average Composition, and Average Thickness of Individual Layers and Interface Between Individual Layers The concentrations or levels of the components of each layer are determined by averaging values observed in a longitudinal cross-section of a sample by energy dispersive X-ray spectroscopy (EDS) of a scanning electron microscope (SEM) and a transmission electron microscope (TEM).

In the claims and specification, the surface of the tool substrate is defined as a reference line of the rough interface between the tool substrate and the coating layer in the observed image of the longitudinal section. In other words, in the case of a tool substrate having a flat surface such as an insert, elements are mapped by EDS on the longitudinal section, and the obtained map is subjected to known image processing. The interface between the lower layer and the tool substrate is determined by known image processing on the obtained elemental map, and the average line of the roughness curve of the interface between the lower layer and the tool substrate is obtained arithmetically, and is defined as the surface of the tool substrate. The direction perpendicular to the average line is defined by the direction of the thickness of the layer perpendicular to the tool substrate.

Even in the case of a tool substrate having a curved surface such as a drill, a tool diameter sufficiently large in relation to the thickness of the coating layer has a flat interface between the coating layer and the tool substrate in the measured area. The surface of the tool substrate can thereby be determined by the same process. For example, in the case of a drill, elemental mapping by EDS is performed on the longitudinal section of the coating layer in the cross-section perpendicular to the axial direction, and by performing known image processing on the obtained elemental map. The interface between the lower layer (A layer) and the tool substrate is determined, and the average line of the rough interface between the lower layer (A layer) and the tool substrate measured in this way is determined arithmetically, and this is used as the tool substrate surface. The direction perpendicular to this average line is the direction of the thickness of the layer perpendicular to the tool substrate.

The area for measurement in the longitudinal section is determined so as to include the entire thickness of the coating layer. In consideration of the total thickness of the coating layer and the measurement accuracy of the thickness, it is preferred to observe and measure multiple fields of view (e.g., three fields of view) of about 10 μm×10 μm.

Since the B layer, the C layer, and the E layer each have a repeated variations in Si or W level, the Si or W level in each layer is measured on several lines, for example, five lines vertical to the surface of the tool substrate (in the direction of the layer), where a position of one atomic % (b=0.01 or β=0.01) is defined as an interface with the adjacent layer, and the thicknesses are determined for the multiple lines and averaged. With the C layer and the E layer, which are each a single layer, the average thickness is determined by averaging the thicknesses measured on multiple analytical lines for this layer.

2. Identification of Crystal Grains with NaCl-Type Face-Centered Cubic Structure The crystal structure of each of the A layer, B layer, C layer and E layer is identified to be a NaCl-type face-centered cubic structure by electron diffraction with a transmission electron microscope (TEM).

EXAMPLES

The present invention will now be described below with examples, but the invention is not limited to these examples.

Example A

This example describes a coated tool provided with a coating layer including a lower layer (A layer), an intermediate layer (B layer), and an upper layer (C layer), as shown in FIG. 1.

A drill substrate was prepared as a tool substrate.

1. Production of Drill Substrate

Raw powders of Co, VC, TaC, NbC, $Cr_3C_2$, and WC each having an average grain diameter in a range of 0.5 to 5 µm were prepared. These powders were compounded into compositions shown in Table 1, and wax was added to the mixtures followed by wet mixing for 72 hours in a ball mill. The mixtures were then dried under reduced pressure and compacted under a pressure of 100 Mpa.

After the resulting green compacts were sintered into round bar sinters with a diameter of 3 mm for tool substrates, which were then shaped by grinding into WC-based cemented carbide drill substrates 1 to 3 with a groove forming section of 2 mm diameter by 45 mm length and a double-edge shape with a torsional angle of 30 degrees.

TABLE 1

| Drill substrate | Composition (Mass %) | | | | | |
| --- | --- | --- | --- | --- | --- | --- |
| | Co | VC | TaC | NbC | $Cr_3C_2$ | WC and incidental impurities |
| 1 | 8.0 | — | 0.9 | 0.1 | — | Balance |
| 2 | 6.0 | 0.1 | — | — | 0.3 | Balance |
| 3 | 10.0 | — | — | — | 0.7 | Balance |

(Note)
"—" indicates uncompounded.

Deposition Step:

The drill substrates 1 to 3 were subjected to the following procedures (a) to (e) for layer deposition in an arc ion plating system shown in FIGS. 5 and 6.

An arc ion plating system shown in FIGS. 5 and 6 is provided with an anode (20), a heater (24), a reaction gas inlet (27), an exhaust gas outlet (28), an arc power supply (29), and a bias power supply (30), in addition to the turn table (25) and the targets (21, 22, 23), which are described above.

(a) Drill substrates 1 to 3 were ultrasonically cleaned in acetone, dried, and mounted along the outer circumference at a predetermined radial distance from the central axis on the turn table in the arc ion plating system.

(b) While being evacuated to a vacuum of $10^{-2}$ Pa or less, the system was heated to 500° C. with a heater. The system was then set to an Ar gas atmosphere of 0.2 Pa, and a DC bias voltage of −200 V was applied for 20 minutes to the tool substrate spinning on the turn table to bombard the surface of the drill substrate with argon ions.

(c) The system was purged with nitrogen reactive gas of a given pressure as shown in Table 2 within a range of 2.0 to 8.0 Pa and was maintained at a temperature as shown in Table 2. The turn table was controlled to the rotation speed shown in Table 2, a DC bias voltage in a range of −30 to −60 V shown in Table 2 was applied to the drill substrate spinning on the turn table, and a current in a range of 100 to 150 A shown in Table 2 was applied between the Al—Cr alloy target and the anode to generate arc discharge. A lower layer (A layer) with a specified thickness was thereby deposited.

(d) The DC bias voltage adjusted to the specified value within a range of −25 to −60 V as shown in column "B layer deposition condition" in Table 2 was applied to the drill substrate. A current within a range of 100 to 150 A as shown in Table 2 was applied between the Al—Cr alloy target and the anode to generate arc discharge while a current within a range of 150 to 180 A as shown in Table 2 was applied between the Al—Cr—Si alloy target and the anode to generate arc discharge. An intermediate layer consisting of a B layer with a predetermined thickness with a repeated variation in Si level was thereby formed by simultaneous deposition on the surface of the lower layer (A layer) deposited as described above.

(e) The system was purged with a nitrogen reaction gas to create a reaction atmosphere within a range of 2.0 to 8.0 Pa as shown in Table 3 and was maintained at a temperature as shown in Table 3 while the rotation speed of the turntable was controlled as shown in Table 3 and the drill substrate spun on the turntable. A DC bias voltage within a range of −25 to −70 V as shown in Table 3 was applied to the drill substrate spinning on the turn table and a current in a range of 100 to 180 A as shown in Table 3 was applied between the Ti—Si—W alloy target and the anode to generate arc discharge. An upper layer consisting of a C layer of a predetermined thickness with a repeated variation in W level was thereby formed by vapor deposition.

As shown in Table 3, each C layer in Examples 1 to 5 and 7 was formed by the simultaneous deposition using two different Ti—Si—W alloy targets, and the C layer in Example 6 was formed by the deposition of a single Ti—Si—W alloy target and the control of deposition parameters to form a repeated variation in W level in each C layer.

Coating layers each including a lower layer (A layer) and an intermediate layer (B layer) shown in Table 6 and an upper layer (C layer) shown in Table 7 of Examples 1 to 7 were prepared by Processes (a) to (e) above.

In the deposition process (a) to (d) above, the arc current, partial pressure of reactive nitrogen gas, bias voltage, and deposition temperature among deposition conditions for the A layer and B layer were adjusted to control the full width $I_{AB200}/I_{AB111}$ values at half height of $I_{AB200}$ of grains with a rock-salt cubic crystal structure in the intermediate layer by simultaneous deposition using an Al—Cr alloy target and an Al—Cr—Si alloy target.

For comparison, a coating layer including a lower layer (A layer), an intermediate layer (B layer) and an upper layer (C layer) was deposited on each of the drill substrates 1 to 3 as in Example 1 under the conditions 11 to 16 shown in Tables 4 and 5. Coating layers of Comparative examples 1 to 6 shown in Tables 8 and 9 were thereby prepared.

Since the intermediate layer in Comparative Examples 1 to 5 was formed with a single Al—Cr—Si alloy target, no repeated variation in Si level was formed in the intermediate layer, and the Si content across the thickness of the B layer was substantially uniform, as shown in Table 8.

Comparative Examples 1 to 5 differ from Examples in configuration of the intermediate layer (B layer) in this regard. The C layer of Comparative Examples 1 and 6 has a substantially uniform W content across the thickness of the C layer without a repeated variation in W level. Although the C layers in Comparative Examples 1 and 6 were formed by vapor deposition using a single Ti—Si—W alloy target in the same way as the C layer in Example 6, a large absolute values of the system temperature and bias voltage and a small nitrogen gas pressure created an environment where a repeated variation in W level were barely formed compared to Examples.

The longitudinal cross sections of the coating layers of Examples 1 to 6 and Comparative Examples 1 to 6 were examined by scanning electron microscopy (SEM), transmission electron microscopy (TEM), and energy dispersive X-ray spectroscopy (EDS). The compositions of the A layer and B layer and the thicknesses of these layers were measured at multiple sites and averaged to calculate the average composition and average thickness of each layer.

The B layer was further measured across the thickness of the layer by scanning electron microscopy (SEM), transmission electron microscopy (TEM), and energy dispersive X-ray analysis (EDS) to obtain composition distribution curves across the thickness of the layer.

The average $Si_{max}$ of the local maxima of the Si level and the average $Si_{min}$ of the local minima of the Si level were obtained by smoothing the Si content in the composition distribution curve by moving average, which is noise elimination, and the average interval between the adjacent local maxima and local minima points of Si content was measured.

With the C layer, the average $W_{max}$ of the local maxima of the W level at the points containing the local maxima of the W component and the average $W_{min}$ of the local minima of the W level at the points containing the local minima of the W component were obtained in the same way, and the intervals between adjacent W local maxima and W local minima were measured at multiple sites to obtain the average interval between the local maxima and local minima.

X-ray diffraction was also performed on the entire A layer and B layer from a direction perpendicular to the surface of the tool substrate, and the full width at half maximum of the overall X-ray diffraction peak (overlapped X-ray diffraction peaks of the A layer and B layer) from the (200) plane was measured to calculate the ratio $I_{AB200}/I_{AB111}$ from the intensities $I_{AB200}$ and $I_{AB111}$ of the overall X-ray diffraction peaks (overlapped X-ray diffraction peaks of the A layer and B layer).

The C layer was also subjected to X-ray diffraction to measure the X-ray diffraction peak intensity $I_{C200}$ of the 200 diffraction peak and the X-ray diffraction peak intensity $I_{C111}$ of the 111 diffraction peak to calculate the ratio $I_{C200}/I_{C111}$.

An X-ray diffractometer with a Cu tube was used for X-ray diffraction.

FIG. 7 shows the results of X-ray diffraction (X-ray intensity on the vertical axis and angle on the horizontal axis) measured for the overall A layer and B layer in Example 6. The full width at half maximum of $I_{AB200}$ is 0.5 (degrees), and the ratio $I_{AB200}/I_{AB111}$ of $I_{AB200}$ to $I_{AB111}$ was 1.7.

The ratio $I_{C200}/I_{C111}$ of the hard coating layer consisting of the C layer was 0.9.

Tables 6 and 7 show the full width at half maximum of $I_{AB200}$, the ratio $I_{AB200}/I_{AB111}$, and the ratio $I_{C200}/I_{C111}$ for Examples 1 to 7. Tables 8 and 9 show the full width at half maximum of $I_{AB200}$, the ratio $I_{AB200}/I_{AB111}$, and the ratio $I_{C200}/I_{C111}$ for Comparative example tools 1 to 6.

TABLE 2

| Deposition condition of A and B layers | Cathode (target electrode) Al—Cr alloy | Cathode (target electrode) Al—Cr—Si alloy | Deposition Condition | | | | | | | | |
|---|---|---|---|---|---|---|---|---|---|---|---|
| | | | System temp. (° C.) | Turn table rotation speed (rpm) | Deposition of A layer | | | Deposition of B layer | | | |
| | | | | | $N_2$ gas pressure (Pa) | DC bias voltage (V) | Arc current of Al—Cr alloy target (A) | $N_2$ gas pressure (Pa) | DC bias voltage (V) | Arc current of Al—Cr alloy target (A) | Arc current of Al—Cr—Si alloy target (A) |
| 1 | Al60Cr40 | Al35Cr57Si8 | 550 | 3.0 | 2.0 | −30 | 120 | 2.0 | −25 | 120 | 180 |
| 2 | Al70Cr30 | Al65Cr30Si5 | 450 | 2.0 | 4.0 | −40 | 150 | 4.0 | −30 | 150 | 150 |
| 3 | Al50Cr50 | Al40Cr35Si25 | 500 | 1.0 | 8.0 | −30 | 100 | 8.0 | −40 | 100 | 150 |
| 4 | Al60Cr40 | Al60Cr25Si15 | 500 | 2.0 | 4.0 | −50 | 120 | 4.0 | −40 | 120 | 160 |
| 5 | Al50Cr50 | Al65Cr32Si3 | 550 | 2.0 | 2.0 | −60 | 100 | 2.0 | −60 | 100 | 180 |
| 6 | Al70Cr30 | Al60Cr35Si5 | 450 | 2.0 | 4.0 | −30 | 150 | 4.0 | −30 | 150 | 150 |
| 7 | Al65Cr35 | Al65Cr32Si3 | 500 | 2.0 | 3.0 | −35 | 100 | 3.0 | −30 | 100 | 180 |

TABLE 3

| Deposition condition of C layer | Cathode (target electrode) Ti—Si—W alloy target | Cathode (target electrode) Ti—Si—W alloy target | System temp. (° C.) | Turn table rotation speed (rpm) | N₂ gas pressure (Pa) | DC bias voltage (V) | Arc current (A) |
|---|---|---|---|---|---|---|---|
| 1 | Ti77Si5W18 | Ti97Si1W2 | 500 | 2.0 | 6.0 | −25 | 150 |
| 2 | Ti77Si20W3 | Ti82Si10W8 | 450 | 2.0 | 4.0 | −30 | 180 |
| 3 | Ti80Si15W5 | Ti80Si5W15 | 500 | 1.5 | 2.0 | −25 | 100 |
| 4 | Ti87Si8W5 | Ti97Si1W2 | 550 | 2.0 | 4.0 | −50 | 150 |
| 5 | Ti69Si30W1 | Ti87Si10W3 | 550 | 3.0 | 8.0 | −70 | 180 |
| 6 | Ti85Si10W5 | — | 450 | 1.5 | 4.0 | −40 | 180 |
| 7 | Ti77Si20W3 | Ti84Si15W1 | 550 | 3.0 | 2.0 | −60 | 120 |

(Note)
"—" indicates unused.

TABLE 4

| Deposition condition of A and B layers | Cathode (target electrode) Al—Cr alloy | Cathode (target electrode) Al—Cr—Si alloy | System temp. (° C.) | Turn table rotation speed (rpm) | Deposition of A layer N₂ gas pressure (Pa) | Deposition of A layer DC bias voltage (V) | Deposition of A layer Arc current of Al—Cr alloy target (A) | Deposition of B layer N₂ gas pressure (Pa) | Deposition of B layer DC bias voltage (V) | Deposition of B layer Arc current of Al—Cr alloy target (A) | Deposition of B layer Arc current of Al—Cr—Si alloy target (A) |
|---|---|---|---|---|---|---|---|---|---|---|---|
| 11 | Al85Cr15 | Al65Cr30Si5 | 450 | 1.5 | 4.0 | −50 | 150 | 4.0 | −75 | 150 | 180 |
| 12 | Al70Cr30 | Al40Cr30Si30 | 550 | 2.0 | 2.0 | −30 | 120 | 2.0 | −60 | 120 | 120 |
| 13 | Al30Cr70 | Al40Cr50Si10 | 500 | 1.5 | 4.0 | −75 | 150 | 4.0 | −50 | 150 | 150 |
| 14 | Al40Cr60 | Al65Cr15Si20 | 550 | 2.0 | 2.0 | −30 | 180 | 2.0 | −50 | 180 | 120 |
| 15 | Al50Cr50 | Al45Cr40Si15 | 500 | 1.5 | 4.0 | −50 | 120 | 4.0 | −50 | 120 | 150 |
| 16 | Al60Cr40 | Al10Cr75Si15 | 450 | 2.0 | 6.0 | −40 | 100 | 6.0 | −30 | 100 | 180 |

TABLE 5

| Deposition condition of C layer | Cathode (target electrode) Ti—Si—W alloy target | Cathode (target electrode) Ti—Si—W alloy target | System temp. (° C.) | Turn table rotation speed (rpm) | N₂ gas pressure (Pa) | DC bias voltage (V) | Arc current (A) |
|---|---|---|---|---|---|---|---|
| 11 | Ti85Si10W5 | — | 550 | 1.5 | 2.0 | −75 | 100 |
| 12 | Ti85Si5W10 | Ti79Si1W20 | 450 | 3.0 | 4.0 | −50 | 120 |
| 13 | Ti88Si8W4 | Ti96Si2W2 | 500 | 1.5 | 8.0 | −40 | 180 |
| 14 | Ti67Si30W3 | Ti73Si20W7 | 450 | 2.0 | 5.0 | −50 | 150 |
| 15 | Ti80Si2W18 | Ti90Si8W2 | 500 | 1.5 | 6.0 | −30 | 180 |
| 16 | Ti84Si15W1 | — | 550 | 2.0 | 3.0 | −100 | 120 |

(Note)
"—" indicates unused.

TABLE 6

| Type | | Drill substrate | Deposition condition of A, B, and D layers | Hard coating layer | | | | |
|---|---|---|---|---|---|---|---|---|
| | | | | Lower layer (A layer) | | Intermediate layer (B layer) | | |
| | | | | Average content (x) | Average thickness (μm) | Average content (a) | Average content (b) | $Si_{max}/b$ |
| Example | 1 | 1 | 1 | 0.39 | 1.0 | 0.49 | 0.05 | 1.3 |
| | 2 | 2 | 2 | 0.31 | 0.3 | 0.28 | 0.03 | 1.8 |
| | 3 | 3 | 3 | 0.48 | 3.0 | 0.40 | 0.14 | 1.8 |
| | 4 | 1 | 4 | 0.41 | 1.0 | 0.29 | 0.10 | 1.7 |
| | 5 | 2 | 5 | 0.49 | 2.5 | 0.38 | 0.02 | 1.5 |
| | 6 | 3 | 6 | 0.28 | 0.5 | 0.31 | 0.03 | 2.0 |
| | 7 | 1 | 7 | 0.38 | 2.0 | 0.37 | 0.03 | 1.5 |

| Type | | Hard coating layer | | | | |
|---|---|---|---|---|---|---|
| | | Intermediate layer (B layer) | | | | |
| | | $Si_{min}/b$ | Average interval between local maxima and local minima of Si level (nm) | Average thickness (μm) | Full width at half maximum of combined (200) diffraction peak of A and B layers | Ratio $I_{AB200}/I_{AB111}$ of combined X-ray diffraction peak intensity of A and B layers |
| Example | 1 | 0.7 | 5 | 3.0 | 0.7 | 0.7 |
| | 2 | 0.2 | 19 | 1.2 | 0.6 | 2.0 |
| | 3 | 0.2 | 71 | 1.0 | 0.3 | 1.1 |
| | 4 | 0.3 | 53 | 1.5 | 0.8 | 3.1 |
| | 5 | 0.5 | 38 | 0.4 | 0.4 | 6.0 |
| | 6 | 0.0 | 21 | 1.0 | 0.5 | 1.7 |
| | 7 | 0.5 | 35 | 3.5 | 0.4 | 0.4 |

(Note)
Intermediate layer (B layer) has a repeated variation in Si level.

TABLE 7

| Type | | Drill substrate | Deposition condition of C layer | Hard coating layer | | | | | | | Total thickness of the hard coating layer (μm) |
|---|---|---|---|---|---|---|---|---|---|---|---|
| | | | | Upper layer (C layer) | | | | | | | |
| | | | | Average content (α) | Average content (β) | $W_{max}/\beta$ | $W_{min}/\beta$ | Average interval between local maxima and local minima of W level (nm) | Average thickness (μm) | Ratio $I_{c200}/I_{c111}$ of X-ray diffraction peak intensity of C layer | |
| Example | 1 | 1 | 1 | 0.03 | 0.10 | 1.8 | 0.2 | 39 | 3.5 | 7.1 | 7.5 |
| | 2 | 2 | 2 | 0.15 | 0.05 | 1.5 | 0.5 | 22 | 0.5 | 1.4 | 2.0 |
| | 3 | 3 | 3 | 0.10 | 0.10 | 1.6 | 0.4 | 81 | 2.0 | 3.9 | 6.0 |
| | 4 | 1 | 4 | 0.05 | 0.03 | 1.3 | 0.7 | 52 | 1.5 | 2.5 | 4.0 |
| | 5 | 2 | 5 | 0.20 | 0.02 | 1.1 | 0.9 | 5 | 0.4 | 0.6 | 1.0 |
| | 6 | 3 | 6 | 0.10 | 0.05 | 1.5 | 0.5 | 16 | 1.0 | 0.9 | 2.5 |
| | 7 | 1 | 7 | 0.17 | 0.02 | 1.2 | 0.8 | 8 | 1.0 | 1.2 | 6.5 |

TABLE 8

| | | | Hard coating layer | | | | |
| --- | --- | --- | --- | --- | --- | --- | --- |
| | | Deposition | Lower layer (A layer) | | Intermediate layer (B layer) | | |
| Type | Drill substrate | condition of A, B, and D layers | Average content (x) | Average thickness (μm) | Average content (a) | Average content (b) | $Si_{max}/b$ |
| Comparative Example | 1 | 11 | 0.16 | 1.0 | 0.29 | 0.05 | — |
| | 2 | 12 | 0.30 | 0.2 | 0.28 | 0.29 | — |
| | 3 | 13 | 0.69 | 0.5 | 0.51 | 0.10 | — |
| | 4 | 14 | 0.58 | 1.0 | 0.15 | 0.21 | — |
| | 5 | 15 | 0.47 | 2.0 | 0.39 | 0.14 | — |
| | 6 | 16 | 0.41 | 1.0 | 0.64 | 0.09 | 1.7 |

| | | | Hard coating layer Intermediate layer (B layer) | | | |
| --- | --- | --- | --- | --- | --- | --- |
| Type | | $Si_{min}/b$ | Average interval between local maxima and local minima of Si level (nm) | Average thickness (μm) | Full width at half maximum of combined (200) diffraction peak of A and B layers | Ratio $I_{AB200}/I_{AB111}$ of combined X-ray diffraction peak intensity of A and B layers |
| Comparative Example | 1 | — | — | 5.0 | 0.6 | 0.3 |
| | 2 | — | — | 0.8 | 1.1 | 3.6 |
| | 3 | — | — | 1.5 | 0.7 | 1.3 |
| | 4 | — | — | 1.5 | 0.4 | 0.7 |
| | 5 | — | — | 1.0 | 0.6 | 1.8 |
| | 6 | 0.3 | 29 | 1.0 | 0.5 | 2.2 |

(Note)
"—" in Intermediate layer indicates no repeated variation in Si level.

TABLE 9

| | | | Hard coating layer | | | | | | | |
| --- | --- | --- | --- | --- | --- | --- | --- | --- | --- | --- |
| | | | Upper layer (C layer) | | | | | | | Total |
| Type | | Drill substrate | Deposition condition of C layer | Average content (α) | Average content (β) | $W_{max}/β$ | $W_{min}/β$ | Average interval between local maxima and local minima of W level (nm) | Average thickness (μm) | Ratio $I_{C200}/I_{C111}$ of X-ray diffraction peak intensity of C layer | thickness of hard coating layer (μm) |
| Comparative example | 1 | 1 | 11 | 0.09 | 0.05 | — | — | — | 2.0 | 0.7 | 8.0 |
| | 2 | 2 | 12 | 0.03 | 0.14 | 1.5 | 0.5 | 12 | 0.5 | 1.2 | 1.5 |
| | 3 | 3 | 13 | 0.05 | 0.03 | 1.2 | 0.8 | 78 | 1.0 | 1.6 | 3.0 |
| | 4 | 1 | 14 | 0.24 | 0.05 | 1.1 | 0.9 | 50 | 2.5 | 4.4 | 5.0 |
| | 5 | 2 | 15 | 0.06 | 0.10 | 1.8 | 0.2 | 29 | 5.0 | 12 | 8.0 |
| | 6 | 3 | 16 | 0.15 | 0.01 | — | — | — | 1.5 | 2.1 | 3.5 |

(Note)
"—" indicates no repeated variation in W level.

Wet-type high-speed, high-feed drilling tests of SCM440 were then conducted on the tools of Examples 1 to 7 and Comparative Examples 1 to 6 (the normal cutting speed was 50 m/min and the feed rate was 0.06 mm/rev) (using water-soluble cutting oil) under the following conditions:

Workpiece—flat dimension: alloy steel SCM440 plate;
Cutting speed: 70 m/min;
Feed: 0.08 mm/rev; and
Hole depth: 40 mm.

The number of holes drilled was counted until the flank wear width of the cutting edge surface reaches 0.3 mm or until the end of life due to chipping or fracture of the cutting edge or due to breakage, and the state of wear of the cutting edge was observed. The number of holes drilled was up to 1000 holes, and the flank wear width after 1000 holes drilling was measured for samples that did not reach the end of their service life.

Table 10 shows the results of measurements.

TABLE 10

| Type | | Frank wear width (mm) | Wear and tear of cutting edge (chipping, fracture, breakage) |
| --- | --- | --- | --- |
| Example | 1 | 0.14 | Not observed |
| | 2 | 0.09 | Not observed |
| | 3 | 0.13 | Not observed |
| | 4 | 0.10 | Not observed |

TABLE 10-continued

| Type | | Frank wear width (mm) | Wear and tear of cutting edge (chipping, fracture, breakage) |
|---|---|---|---|
| | 5 | 0.17 | Not observed |
| | 6 | 0.11 | Not observed |
| | 7 | 0.18 | Not observed |
| Comparative Example | 1 | *100 | Breakage |
| | 2 | *800 | Fracture |
| | 3 | 0.22 | Chipping |
| | 4 | *500 | Fracture |
| | 5 | *400 | Breakage |
| | 6 | 0.21 | Chipping |

(Note)
*indicates the number of holes drilled up to the end of life due to chipping, fracture, and breakage.

The results in Table 10 demonstrates that the average wear width of the flank surface in Examples was about 0.13 mm, and no chipping, fracture, or breakage was observed whereas Comparative Examples all showed progressive wear on the flank surface, and some of them reached the end of their service life due to chipping, fracture, or breakage in a short time.

Example B

An example corresponding to the embodiment of a coated tool with a coating layer having a lower layer (A layer), an intermediate layer (D layer) and an upper layer (C layer), as shown in FIG. 3 will now be described.

Drill substrates 1 to 3 made of WC-based cemented carbide fabricated in Example A were placed into an arc ion plating system shown in FIGS. 5 and 6. The lower layer (A layer) was formed under the conditions shown in Table 2 in the same manner as deposition processes (a) to (c) in Example A.

An intermediate layer (D layer with an alternating stacked structure of B layers and A layers) was then deposited under the following conditions (f) to (h):

(f) After a single B layer with a predetermined average thickness was deposited, in which a repeated variation in Si level is formed as in Process (d) in Example A, the deposition with the Al—Cr—Si alloy target was stopped. A predetermined current in a range of 100 to 150 A as shown in Table 2 was applied between the Al—Cr alloy target and the anode to generate arc discharge to deposit a single A layer with an average thickness.

(g) Process (f) was repeated to form an intermediate layer consisting of a D layer with an average thickness. The intermediate layer was deposited such that its surface (the layer closest to the tool surface) is a B layer.

(h) An upper layer including a C layer of a predetermined thickness was formed by vapor deposition under the conditions shown in Table 3 on the surface of the intermediate layer consisting of the D layer deposited in Process (g), in a manner similar to Deposition process (e) in Example A.

Hard coating layers with lower layers (A layers) and intermediate layers (D layers consisting of alternating stacked structures of B and A layers) shown in Table 11 and upper layers (C layers) shown in Table 12 of Examples 11 to 17 were prepared by the above process.

The average composition and the average thickness of each layer were calculated for Examples 11 to 17 as in Example A.

The D layer was also analyzed across the thickness by scanning electron microscopy (SEM), transmission electron microscopy (TEM), and energy dispersive X-ray spectroscopy (EDS) to determine the intervals between adjacent Si local maxima and Si local minima, the average $Si_{max}$ and $Si_{min}$ along the thickness of the layer, and the average interval between adjacent Si local maxima and Si local minima.

The average $W_{max}$ and $W_{min}$ were also calculated for the C layer, as well as the average interval between adjacent W local maxima and W local minima.

The lower layer and the intermediate layer were subjected to X-ray diffractometry to measure the full width at half maximum of the 200 X-ray diffraction peak (the overlapped X-ray diffraction peak of the A layer and the B layer), and the ratio $I_{AB200}/I_{AB111}$ was calculated from the intensities $I_{AB200}$ and $I_{AB111}$ of the overall X-ray diffraction peak (the overlapped X-ray diffraction peak of the A layer and the B layer).

The C layer was also subjected to X-ray diffraction, and the 200 X-ray diffraction peak intensity $I_{C200}$ and the 111 X-ray diffraction peak intensity $I_{C111}$ were measured, to calculate the ratio $I_{C200}/I_{C111}$.

Tables 11 and 12 shows the data determined through the above-mentioned process.

TABLE 11

| | | | | Hard coating layer | | | | | |
|---|---|---|---|---|---|---|---|---|---|
| | | | | Lower layer (A layer) | | Intermediate layer (D layer) | | | |
| | | | | | | A layer | | B layer | |
| | | | Deposition | | | Average | | | |
| | | | condition | Average | Average | Average | thickness in | Average | Average |
| | | Drill | of A, B, and | content | thickness | content | single layer | content | content |
| Type | | substrate | D layers | (x) | (μm) | (x) | (μm) | (a) | (b) | $Si_{max}/b$ |
| Example | 11 | 1 | 1 | 0.39 | 1.0 | 0.39 | 1.0 | 0.50 | 0.05 | 1.3 |
| | 12 | 2 | 2 | 0.28 | 0.5 | 0.29 | 0.5 | 0.29 | 0.03 | 1.8 |
| | 13 | 3 | 3 | 0.49 | 0.5 | 0.50 | 0.5 | 0.40 | 0.14 | 1.8 |
| | 14 | 1 | 4 | 0.40 | 1.0 | 0.39 | 0.4 | 0.28 | 0.09 | 1.7 |
| | 15 | 2 | 5 | 0.48 | 0.5 | 0.49 | 0.5 | 0.37 | 0.02 | 1.5 |
| | 16 | 3 | 6 | 0.27 | 0.5 | 0.29 | 0.3 | 0.33 | 0.03 | 2.0 |
| | 17 | 1 | 7 | 0.37 | 1.5 | 0.38 | 0.5 | 0.36 | 0.03 | 1.5 |

TABLE 11-continued

| | | B layer | | Hard coating layer Intermediate layer (D layer) | | |
|---|---|---|---|---|---|---|
| Type | | $Si_{min}/b$ | Average interval between local maxima and local minima of Si level (nm) | Average thickness (μm) | Average thickness of intermediate layer (μm) | Full width at half maximum of combined (200) diffraction peak of A and B layers | Ratio $I_{AB200}/I_{AB111}$ of combined X-ray diffraction peak intensity of A and B layers |
| Example | 11 | 0.7 | 5 | 1.0 | 3.0 | 0.5 | 0.5 |
| | 12 | 0.2 | 20 | 0.5 | 3.5 | 0.6 | 0.9 |
| | 13 | 0.2 | 69 | 1.0 | 4.0 | 0.4 | 0.7 |
| | 14 | 0.3 | 53 | 0.4 | 2.0 | 0.6 | 1.1 |
| | 15 | 0.5 | 39 | 0.5 | 1.5 | 0.4 | 1.8 |
| | 16 | 0.0 | 21 | 0.3 | 1.5 | 0.7 | 1.2 |
| | 17 | 0.5 | 36 | 1.0 | 4.0 | 0.5 | 0.4 |

(Note)
The intermediate layer (D layer) is an alternating layering of A and B layers, with a repeated variation in Si level in the B layer.

TABLE 12

| | | | | | | Hard coating layer | | | | | |
|---|---|---|---|---|---|---|---|---|---|---|---|
| | | | | | | Upper layer (C layer) | | | | | Total |
| Type | | Drill substrate | Deposition condition of C layer | Average content (α) | Average content (β) | $W_{max}/\beta$ | $W_{min}/\beta$ | Average interval between local maxima and local minima of W level (nm) | Average thickness (μm) | Ratio $I_{C200}/I_{C111}$ of X-ray diffraction peak intensity of C layer | thickness of hard coating layer (μm) |
| Example | 11 | 1 | 1 | 0.03 | 0.09 | 1.7 | 0.3 | 39 | 2.0 | 0.9 | 6.0 |
| | 12 | 2 | 2 | 0.14 | 0.05 | 1.4 | 0.6 | 23 | 1.0 | 1.4 | 5.0 |
| | 13 | 3 | 3 | 0.09 | 0.10 | 1.5 | 0.5 | 78 | 1.5 | 2.4 | 6.0 |
| | 14 | 1 | 4 | 0.04 | 0.03 | 1.3 | 0.7 | 50 | 1.0 | 1.6 | 4.0 |
| | 15 | 2 | 5 | 0.18 | 0.02 | 1.1 | 0.9 | 6 | 1.5 | 2.8 | 3.5 |
| | 16 | 3 | 6 | 0.10 | 0.05 | 1.6 | 0.4 | 15 | 0.5 | 0.7 | 2.5 |
| | 17 | 1 | 7 | 0.18 | 0.02 | 1.2 | 0.8 | 8 | 1.0 | 1.3 | 6.5 |

Samples of Examples 11 to 17 were then subjected to the wet-type, high-speed, high-feed drilling test of SCM440 (normal cutting speed was 50 m/min and the feed rate was 0.06 mm/rev) (using water-soluble cutting oil) under the following conditions:
Workpiece—flat dimension: alloy steel SCM440 plate,
Cutting speed: 80 m/min,
Feed: 0.09 mm/rev, and
Hole depth: 40 mm.

The number of drilling operations was counted until the frank wear width of the cutting edge surface reaches 0.3 mm or until the end of life due to chipping, fracture, or breakage of the cutting edge. The number of holes drilled and the state of wear of the cutting edge were also observed. The number of holes drilled was up to 1000 holes. With the samples that did not reach the end of their service life, the flank wear width was measured after 1000 holes were formed.

Table 13 shows the results of measurements.

TABLE 13

| Type | | Frank wear width (mm) | Wear and tear of cutting edge (chipping, fracture, breakage) |
|---|---|---|---|
| Example | 11 | 0.14 | Not observed |
| | 12 | 0.08 | Not observed |
| | 13 | 0.11 | Not observed |
| | 14 | 0.11 | Not observed |
| | 15 | 0.12 | Not observed |
| | 16 | 0.10 | Not observed |
| | 17 | 0.15 | Not observed |

Example C

An example corresponding to an embodiment of a coated tool with a lower layer (A layer), an intermediate layer (D layer), an adhesive layer (E layer) and an upper layer (C layer), as shown in FIG. 4, will be described.

Drill substrates 1 to 3 made of WC-based cemented carbide fabricated in Example A were placed into an arc ion plating system shown in FIGS. 5 and 6, and a lower layer (A layer) was formed as in Example B under the conditions shown in Table 2, and an intermediate layer (D layer) was formed by the deposition processes (f) and (g) in Example B.

The following deposition step (i) was carried out.
(i) From an intermediate point in the process of depositing the B layer as the top surface of the intermediate layer (D layer), the deposition of the Al—Cr alloy target was stopped and simultaneous deposition of the C layer was started at the same time under the conditions shown in Table 3 to carry out simultaneous deposition of the B and C layers for a while, to form an adhesive layer (E layer).

After that, deposition of the B layer was stopped and deposition of only the C layer was continued under the conditions shown in Table 3 to form an upper layer consisting of a C layer with a given thickness.

By the processes mentioned above, drills of Examples 21 to 27 shown in Table 14 were fabricated where each drills included a hard coating layer consisting of a lower layer (A layer), an intermediate layer (D layer consisting of alternating B and A layers), an adhesive layer (E layer), and an upper layer (C layer) as shown in Table 11.

The adhesive layer (E layer) has a structure having a repeated variation in Si level.

The average composition of each layer and the average thickness of the single layer were calculated for Examples 21 to 27, as in Examples A and B.

With the E layer and the C layer, the average interval $Si_{max(E)}$ of local maxima and the average interval $Si_{min(E)}$ of local minima of the Si content, and the average interval $W_{max}$ of local maxima and the average interval $W_{min}$ of local minima of the W content were obtained, as in Examples A and B.

The full width at half maximum of the X-ray diffraction peak derived from the (111) plane and the full width at half maximum of the X-ray diffraction peak derived from the (200) plane were measured for the entire A layer and B layer as in Examples A and B, to calculate the ratio $I_{AB200}/I_{AB111}$.

The ratio $I_{C200}/I_{C111}$ of the C layer was also calculated.

Table 14 shows these results.

TABLE 14

| Type | Drill substrate | Deposition condition of A, B, and D layers | Lower layer (A layer) | Intermediate layer (B or D layer) | Adhesive layer (E layer) Average content (k) | Average content (l) | Average content (m) | Average content (n) | $Si_{max(E)}$/m | $Si_{min(E)}$/m |
|---|---|---|---|---|---|---|---|---|---|---|
| Example 21 | | Same as Example 11 | | | 0.44 | 0.26 | 0.04 | 0.05 | 1.3 | 0.7 |
| 22 | | Same as Example 12 | | | 0.38 | 0.15 | 0.09 | 0.02 | 1.9 | 0.7 |
| 23 | | Same as Example 3 | | | 0.39 | 0.20 | 0.12 | 0.05 | 1.7 | 0.3 |
| 24 | | Same as Example 4 | | | 0.46 | 0.15 | 0.08 | 0.02 | 1.7 | 0.3 |
| 25 | | Same as Example 15 | | | 0.39 | 0.19 | 0.11 | 0.01 | 1.6 | 0.4 |
| 26 | | Same as Example 6 | | | 0.43 | 0.16 | 0.06 | 0.03 | 1.8 | 0.2 |
| 27 | | Same as Example 17 | | | 0.40 | 0.17 | 0.10 | 0.01 | 2.0 | 0.1 |

| Type | Adhesive layer (E layer) Average interval between local maxima and local minima of Si level (nm) | Average thickness (μm) | Average content (α) | Average content (β) | $W_{max}/β$ | $W_{min}/β$ | Upper layer (C layer) Average interval between local maxima and local minima of W level (nm) | Average thickness (μm) | Ratio $I_{C200}/I_{C111}$ of X-ray diffraction peak intensity of C layer | Total thickness of hard coating layer (μm) |
|---|---|---|---|---|---|---|---|---|---|---|
| Example 21 | 4 | 0.5 | 0.03 | 0.09 | 1.7 | 0.3 | 41 | 2.0 | 0.8 | 6.5 |
| 22 | 16 | 0.5 | 0.14 | 0.05 | 1.4 | 0.6 | 20 | 1.0 | 1.4 | 5.5 |
| 23 | 39 | 0.3 | 0.10 | 0.10 | 1.6 | 0.4 | 80 | 2.0 | 3.4 | 6.3 |
| 24 | 31 | 1.0 | 0.05 | 0.03 | 1.3 | 0.7 | 48 | 1.5 | 2.3 | 5.0 |
| 25 | 25 | 0.5 | 0.18 | 0.02 | 1.1 | 0.9 | 5 | 1.5 | 2.6 | 4.0 |
| 26 | 10 | 0.3 | 0.10 | 0.05 | 1.5 | 0.5 | 16 | 1.0 | 1.4 | 2.8 |
| 27 | 28 | 0.3 | 0.18 | 0.02 | 1.2 | 0.8 | 9 | 1.0 | 1.4 | 6.8 |

(Note)

The adhesive layer (E layer) is a layer deposited simultaneously with the B layer, which is the top surface layer of the D layer, and the C layer, and in the E layer has a repeated variation in Si level.

Wet-type high-speed, high-feed drilling tests were performed on Examples 21 to 27 under the same cutting conditions as in Example B. The number of holes drilled was counted until the flank wear width of the cutting edge surface reaches 0.3 mm or until the end of life due to chipping or fracture of the cutting edge or due to breakage, and the state of wear of the cutting edge was observed. The number of holes drilled was up to 1000 holes, and the flank wear width after 1000 holes drilling was measured for samples that did not reach the end of their service life.

Table 15 shows the results of testing.

TABLE 15

| Type | | Frank wear width (mm) | Wear and tear of cutting edge (chipping, fracture, breakage) |
|---|---|---|---|
| Example | 21 | 0.13 | Not observed |
| | 22 | 0.07 | Not observed |
| | 23 | 0.11 | Not observed |
| | 24 | 0.10 | Not observed |
| | 25 | 0.10 | Not observed |
| | 26 | 0.09 | Not observed |
| | 27 | 0.15 | Not observed |

The results shown in Tables 13 and 15 demonstrate that the drills exhibit an average flank wear width of about 0.12 mm (Examples 11 to 17) and about 0.11 mm (Examples 21 to 27) indicating high wear resistance, reduced chipping and fracture and no drill breakage.

The results evidentially show that Examples 21 to 27 are superior to Examples 11 to 17 in terms of abrasion resistance.

The results of the cutting test of the comparative examples are not shown in Tables 13 or 15. Since this cutting test is more severe than the cutting test in Table 10, it is clear from the results in Table 10 that Comparative Examples each have a short life due to progressive wear on the flank surface, without actually performing this cutting test on Comparative Examples.

These results show that Examples exhibit excellent chipping resistance, fracture resistance, and wear resistance in high-load cutting of work materials such as carbon steel, alloy steel, and stainless steel, and no breakage occurs in a drill tool.

The disclosed embodiments are illustrative only and are not restrictive in all respects. The scope of the invention is indicated by the claims, not the embodiments, and is intended to include all modifications within the meaning and scope of the claims and equivalents.

REFERENCE SIGNS LIST

1 tool substrate
2 lower layer
3 intermediate layer
3' intermediate layer (alternately deposited)
4 upper layer
5 adhesive layer
10 A layer ((Al,Cr)N layer)
11 B layer ((Al,Cr,Si)N layer)
12 C layer ((Ti,Si,W)N layer)
13 D layer (alternating A layers and B layers)
14 E layer ((Al,Ti,Cr,Si,W)N layer)
20 anode
21 Ti—Si—W alloy target (cathode)
22 Al—Cr—Si alloy target (cathode)
23 Al—Cr alloy target (cathode)
24 heater
25 turn table
26 tool substrate (showing overall shape)
27 reactive gas inlet
28 exhaust gas outlet
29 arc power supply
30 bias power supply
31 h-WC peak
32 (111) diffraction peak derived from C layer
33 combined (111) diffraction peak derived from A layer and B layer
34 (200) diffraction peak derived from C layer
35 combined (200) diffraction peak derived from A layer and B layer

The invention claimed is:

1. A surface coated cutting tool comprising: a tool substrate and a coating layer on a surface of the tool substrate; wherein
   1) the coating layer has an average thickness in a range of 0.5 μm to 8.0 μm, and the coating layer comprises a lower layer, an intermediate layer, and an upper layer, in sequence from the tool substrate toward the surface of the tool;
   2) the lower layer has an average thickness in a range of 0.1 μm to 4.0 μm and comprises an A layer having an average composition represented by formula: $(Al_{1-x}Cr_x)N$, where x is 0.20 to 0.60;
   3) the intermediate layer has an average thickness in a range of 0.1 μm to 4.0 μm and comprises a B layer having an average composition represented by formula: $(Al_{1-a-b}Cr_aSi_b)N$, where a is 0.20 to 0.60 and b is 0.01 to 0.20;
   4) the B layer has a repeated variation in Si level with an average interval of 1 nm to 100 nm between adjacent local maxima and local minima, and satisfies the relation: $1.0 < Si_{max}/b \leq 2.0$ where $Si_{max}$ is the average of the local maxima of the Si level and the relation: $0.0 \leq Si_{min}/b < 1.0$ where $Si_{min}$ is the average of the local minima of the Si level;
   5) the upper layer has an average thickness in a range of 0.1 μm to 4.0 μm and comprises a C layer having an average composition represented by formula: $(Ti_{1-\alpha-\beta}Si_\alpha W_\beta)N$ where α is 0.01 to 0.20 and β is 0.01 to 0.10; and
   6) the C layer has a repeated variation in W level with an average interval of 1 nm to 100 nm between adjacent local maxima and local minima, and satisfies the relation: $1.0 < W_{max}/\beta \leq 2.0$ where $W_{max}$ is the average of the local maxima of the W level and the relation: $0.0 \leq W_{min}/\beta < 1.0$ where $W_{min}$ is the average of the local minima of the W level.

2. The surface coated cutting tool set forth in claim 1, where the intermediate layer comprises a D layer comprising alternating B layers and A layers, the D layer having an average thickness in a range of 0.5 μm to 4.0 μm, the D layer including at least two B layers.

3. The surface coated cutting tool set forth in claim 1, further comprising an adhesive layer that has an average thickness in a range of 0.1 μm to 2.0 μm and comprises an E layer having a composition represented by formula: $(Al_{1-k-l-m-n}Ti_kCr_lSi_mW_n)N$ where k is 0.20 to 0.65, l is 0.10 to 0.35, m is from above 0.00 to 0.15, and n is from above 0.00 to 0.05; wherein the E layer has a repeated variation in Si level with an average interval of 1 nm to 100 nm between adjacent local maxima and local minima, and satisfies the relation: $1.0 < Si_{max(E)}/m \leq 2.0$ where $Si_{max(E)}$ is the average of the local maxima of the Si level and the relation: $0.0 \leq Si_{min(E)}/b<1.0$ where $Si_{min(E)}$ is the average of the local minima of the Si level.

4. The surface coated cutting tool set forth in claim 1, wherein
- each layer included in the coating layer includes crystal grains having a rock-salt cubic crystal structure;
- a combined X-ray (200) diffraction peak derived from the A layer and the B layer has a full width at half maximum ranging from 0.2 degrees to 1.0 degrees;
- the intensity $I_{AB200}$ of the (200) diffraction peak and the intensity $I_{AB111}$ of the (111) diffraction peak are correlated by expression: $0.5<I_{AB200}/I_{AB111}<10.0$; and
- the intensity $I_{C200}$ of the (200) diffraction peak and the intensity $I_{C111}$ of the (111) diffraction peak derived from the C layer are correlated by expression: $0.5<I_{C200}/I_{C111}<10.0$.

* * * * *